United States Patent
Che et al.

(10) Patent No.: US 12,127,472 B2
(45) Date of Patent: Oct. 22, 2024

(54) PLATINUM (II) SCHIFF BASE COMPLEXES WITH INCREASED EMISSION QUANTUM YIELD FOR RED OLED APPLICATIONS

(71) Applicant: SICHUAN KNOWLEDGE EXPRESS INSTITUTE FOR INNOVATIVE TECHNOLOGIES CO., LTD, Tianfuxinqu Meishan (CN)

(72) Inventors: Chi Ming Che, Hong Kong (CN); Chun Lam Kwong, Hong Kong (CN); Tsz Lung Lam, Hong Kong (CN)

(73) Assignee: SICHUAN KNOWLEDGE EXPRESS INSTITUTE FOR INNOVATIVE TECHNOLOGIES CO., LTD, Sichan (CN)

( * ) Notice: Subject to any disclaimer, the term of this patent is extended or adjusted under 35 U.S.C. 154(b) by 846 days.

(21) Appl. No.: 17/289,599

(22) PCT Filed: Oct. 31, 2019

(86) PCT No.: PCT/CN2019/114666
§ 371 (c)(1),
(2) Date: Apr. 28, 2021

(87) PCT Pub. No.: WO2020/088582
PCT Pub. Date: May 7, 2020

(65) Prior Publication Data
US 2022/0045285 A1 Feb. 10, 2022

Related U.S. Application Data

(60) Provisional application No. 62/753,448, filed on Oct. 31, 2018.

(51) Int. Cl.
*H10K 85/30* (2023.01)
*C07F 15/00* (2006.01)
(Continued)

(52) U.S. Cl.
CPC ....... *H10K 85/346* (2023.02); *C07F 15/0093* (2013.01); *C09K 11/06* (2013.01);
(Continued)

(58) Field of Classification Search
None
See application file for complete search history.

(56) References Cited

U.S. PATENT DOCUMENTS

2006/0068222 A1  3/2006  Kitamura et al.
2006/0210828 A1  9/2006  Nakayama et al.
(Continued)

FOREIGN PATENT DOCUMENTS

CN  102934251 A  2/2013
CN  105273712 A  1/2016
(Continued)

OTHER PUBLICATIONS

Che et al., "Photophysical Properties and OLED Applications of Phosphorescent Platinum(II) Schiff Base Complexes" Chem. Eur. J., Oct. 13, 2010, 16, 233.
(Continued)

*Primary Examiner* — Jeffrey D Washville
(74) *Attorney, Agent, or Firm* — Maschoff Brennan

(57) ABSTRACT

Red-emitting platinum (II) Schiff base complexes with high emission quantum efficiency are prepared. These materials can be used to fabricate OLEDs.

9 Claims, 3 Drawing Sheets

(51) Int. Cl.
*C09K 11/06* (2006.01)
*H10K 50/11* (2023.01)
*H10K 50/13* (2023.01)
*H10K 71/12* (2023.01)
*H10K 71/16* (2023.01)

(52) U.S. Cl.
CPC .......... *C09K 2211/1011* (2013.01); *C09K 2211/1014* (2013.01); *C09K 2211/1029* (2013.01); *C09K 2211/185* (2013.01); *H10K 50/11* (2023.02); *H10K 50/13* (2023.02); *H10K 71/12* (2023.02); *H10K 71/16* (2023.02)

(56) References Cited

U.S. PATENT DOCUMENTS

| 2006/0264625 | A1 | 11/2006 | Nakayama et al. |
| 2013/0033174 | A1 | 2/2013 | Takaku |
| 2017/0162803 | A1 | 6/2017 | Che et al. |
| 2018/0258119 | A1 | 9/2018 | Che et al. |

FOREIGN PATENT DOCUMENTS

| CN | 108569995 A | 9/2018 |
| WO | 2004096946 A1 | 11/2004 |
| WO | 2005107332 A1 | 11/2005 |
| WO | 2005112520 A1 | 11/2005 |

OTHER PUBLICATIONS

Wong et al., "New phosphorescent platinum(II) Schiff base complexes for PHOLED applications", J. Mater. Chem., Jun. 7, 2012, 22, 16448.

Zhou et al., "Efficient red organic electroluminescent devices by doping platinum(II) Schiff base emitter into two host materials with stepwise energy levels" Opt. Lett., Jul. 15, 2013, 38, 2373.

Gualandi et al., "Synergy, Compatibility, and Innovation: Merging Lewis Acids with Stereoselective Enamine Catalysis", Chem. Asian. J., Feb. 23, 2014, 9, 984.

PLATINUM (II) SCHIFF BASE COMPLEXES WITH INCREASED EMISSION QUANTUM YIELD FOR RED OLED APPLICATIONS

TECHNICAL FIELD

Described herein are platinum(II)-based red emitters and their use in OLED applications.

BACKGROUND OF THE INVENTION

Platinum-based organic light-emitting-diode (OLED) emitters are potential alternatives to conventional iridium emitters, with numerous reports of high phosphorescence quantum yields and emission colors spanning the entire visible spectrum. To realize their commercial introduction, the chemical stability and production cost of platinum OLED emitter must be addressed. Tetradentate Pt(II)-Schiff base complexes are appealing in these endeavors due to their enhanced stability and their ease of synthesis. The structure of Pt(II)-Schiff base complexes can be readily modified to emit in the red spectral region with a high spectral purity, which is advantageous for red OLED applications. For example, Che et al., *Chem. Eur. J.*, 2010, 16, 233; *Opt. Lett.*, 2013, 38, 2373; *Chem. Asian. J.*, 2014, 9, 984, disclose several Pt(II)-Schiff base complexes to fabricate singularly doped nearly pure red OLED devices ($CIE_{x,y}$: 0.61-0.65, 0.34-0.38) that exhibited maximum current efficiency (CE) up to 17.36 cd/A. Wong et al., *J. Mater. Chem.*, 2012, 22, 16448 discloses a red device based on a Pt(II)-Schiff base complex ($CIE_{x,y}$: 0.68, 0.32) with maximum CE of 1.3 cd/A. Unfortunately, the photoluminescent quantum yield, a parameter strongly correlates to the device efficiency and all of the disclosed red-emitting Pt(II)-Schiff base complexes never exceeds 0.3. Therefore, Pt(II)-Schiff base complexes require a different molecular design to achieve an enhanced photoluminescent quantum yield to realize more efficient red OLEDs.

BRIEF SUMMARY OF THE INVENTION

In an embodiment of the invention, red-emitting platinum (II) Schiff base complexes that show high photoluminescent quantum yield have the chemical structure:

Structure I

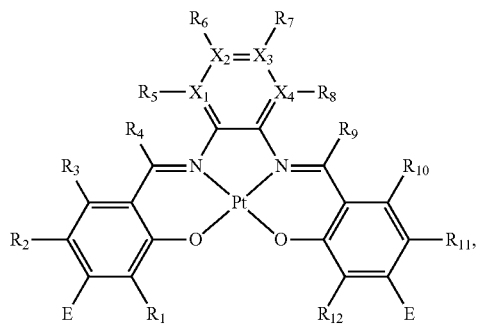

where Pt has an oxidation state of II complexed to a tetradentate ligand where: $X_1$-$X_4$ are independently carbon, nitrogen, silicon or phosphorous; $R_1$-$R_{12}$ are independently selected from hydrogen, halogen, hydroxyl, unsubstituted alkyl, substituted alkyl, cycloalkyl, unsubstituted aryl, substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or alkoxycarbonyl; and E is an emission intensity enhancement group comprising an aromatic group conjugated to the ligand's phenyl groups, where adjacent $R_1$-$R_{12}$ and E groups can independently form a 5-8 member ring.

An embodiment of the invention is directed to a red OLED devices including a platinum(II) emitter of Structure I. Advantageously, the OLED devices show high efficiency.

DETAILED DISCLOSURE OF THE INVENTION

Definitions

Figure 1:
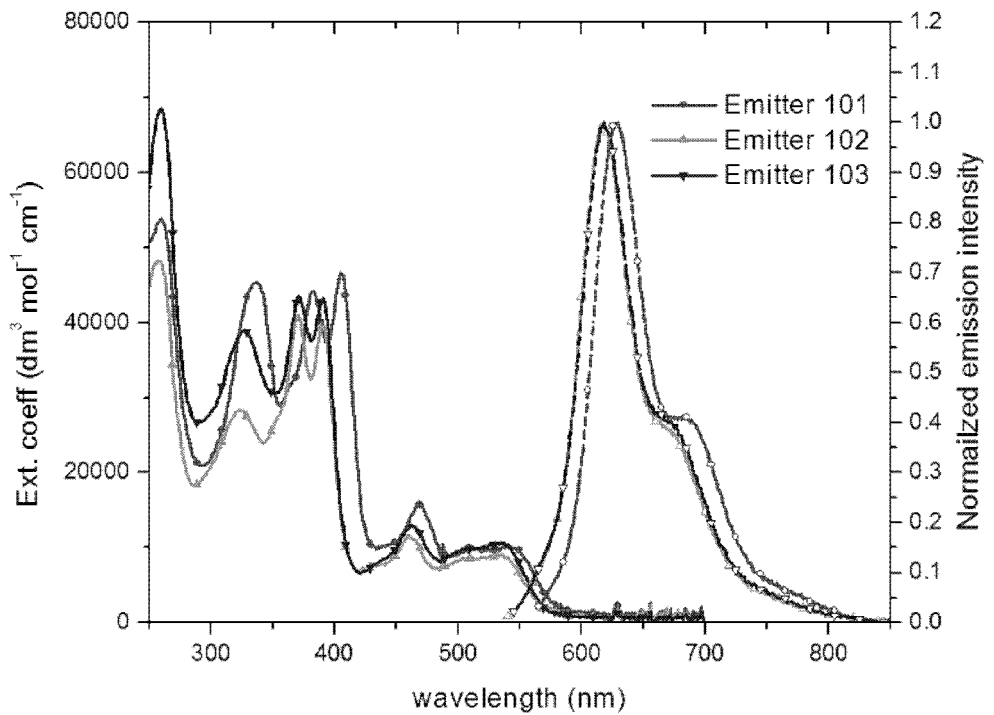
FIG. 1 shows composite UV-vis and photoluminescent spectra of Emitter 101-103 in $CH_2Cl_2$ at 298K.

Disclosure herein, terms, abbreviations or other shorthand are defined below. Any term, abbreviation or shorthand not defined is understood to have the ordinary meaning used by a skilled artisan contemporaneous with the submission of this application.

"Amino" refers to a primary, secondary, or tertiary amine which may be optionally substituted. Specifically included are secondary or tertiary amine nitrogen atoms which are members of a heterocyclic ring. Also specifically included, for example, are secondary or tertiary amino groups substituted by an acyl moiety. Some non-limiting examples of an amino group include —NR'R" wherein each of R' and R" is independently H, alkyl, aryl, aralkyl, alkaryl, cycloalkyl, acyl, heteroalkyl, heteroaryl or heterocycyl.

"Alkyl" refers to a fully saturated acyclic monovalent radical containing carbon and hydrogen, and which may be branched or a straight chain. Examples of alkyl groups include, but are not limited to, alkyl having 1-20, 1-10 or 1-6 carbon atoms, methyl, ethyl, n-propyl, isopropyl, n-butyl, t-butyl, n-heptyl, n-hexyl, n-octyl, and n-decyl.

"Alkylamino" means a radical —NHR or —$NR_2$ where each R is independently an alkyl group. Representative examples of alkylamino groups include, but are not limited to, methylamino, (1-methylethyl)amino, methylamino, dimethylamino, methylethylamino, and di(1-methylethyl) amino.

The term "hydroxyalkyl" means an alkyl radical as defined herein, substituted with one or more, preferably one, two or three hydroxy groups. Representative examples of hydroxyalkyl include, but are not limited to, hydroxymethyl, 2-hydroxyethyl, 2-hydroxypropyl, 3-hydroxypropyl, 1-(hydroxymethyl)-2-methylpropyl, 2-hydroxybutyl, 3-hydroxybutyl, 4-hydroxybutyl, 2,3-dihydroxypropyl, 2-hydroxy-1-hydroxymethylethyl, 2,3-dihydroxybutyl, 3,4-dihydroxybutyl and 2-(hydroxymethyl)-3-hydroxy-propyl, preferably 2-hydroxyethyl, 2,3-dihydroxypropyl, and 1-(hydroxymethyl)-2-hydroxyethyl.

The term "alkoxy," as used herein, refers the radical —OR, where R is alkyl. Exemplary alkoxy groups include, but are not limited to, methoxy, ethoxy, and propoxy.

"Aromatic" or "aromatic group" refers to aryl or heteroaryl.

"Aryl" refers to optionally substituted carbocyclic aromatic groups (e.g., having 6-20 carbon atoms). In some embodiments, the aryl group includes phenyl, biphenyl, naphthyl, substituted phenyl, substituted biphenyl or substituted naphthyl. In other embodiments, the aryl group is phenyl or substituted phenyl.

"Heteroaryl" refers to an aromatic group having at least one non-carbon atom in at least one five or six membered aromatic ring of the group. The heteroaryl group may be substituted or unsubstituted. Some non-limiting examples of heteroaryl include furanyl, thiophenyl, pyrrolyl, imidazolyl, pyrazolyl, oxazolyl, thiazolyl, triazolyl, oxadiazolyl, thiadiazolyl, dioxazolyl, dithiazolyl, tetrazolyl, pyridinyl, pyrimidinyl, phosphininyl, diazinyl, oxazinyl, thiazinyl, dioxinyl, indolyl, isoindolyl, indolizinyl, quinolinyl, isoquinolinyl, purinyl, carbaxolyl, and dibenzofuranyl, where the attachment can be by the substitution for hydrogen of the heteroaryl group.

"Aralkyl" refers to an alkyl group which is substituted with an aryl group. Some non-limiting examples of aralkyl include benzyl and phenethyl.

"Acyl" refers to a monovalent group of the formula —C(=O)H, —C(=O)-alkyl, —C(=O)-aryl, —C(=O)-aralkyl, —C(=O)-alkaryl.

"Halogen" refers to fluorine, chlorine, bromine and iodine.

"Styryl" refers to a univalent radical $C_6H_5$—CH=CH— derived from styrene.

"Substituted" as used herein to describe a compound or chemical moiety refers to that at least one hydrogen atom of that compound or chemical moiety is replaced with a second chemical moiety. Non-limiting examples of substituents are those found in the exemplary compounds and embodiments disclosed herein, as well as halogen; alkyl; heteroalkyl; alkenyl; alkynyl; aryl; heteroaryl; hydroxy; alkoxyl; amino; nitro; thiol; thioether; imine; cyano; amido; phosphonato; phosphine; carboxyl; thiocarbonyl; sulfonyl; sulfonamide; ketone; aldehyde; ester; oxo; haloalkyl (e.g., trifluoromethyl); carbocyclic cycloalkyl, which can be monocyclic or fused or non-fused polycyclic (e.g., cyclopropyl, cyclobutyl, cyclopentyl or cyclohexyl) or a heterocycloalkyl, which can be monocyclic or fused or non-fused polycyclic (e.g., pyrrolidinyl, piperidinyl, piperazinyl, morpholinyl or thiazinyl); carbocyclic or heterocyclic, monocyclic or fused or non-fused polycyclic aryl (e.g., phenyl, naphthyl, pyrrolyl, indolyl, furanyl, thiophenyl, imidazolyl, oxazolyl, isoxazolyl, thiazolyl, triazolyl, tetrazolyl, pyrazolyl, pyridinyl, quinolinyl, isoquinolinyl, acridinyl, pyrazinyl, pyridazinyl, pyrimidinyl, benzimidazolyl, benzothiophenyl or benzofuranyl); amino (primary, secondary or tertiary); o-lower alkyl; o-aryl, aryl; aryl-lower alkyl; —$CO_2CH_3$; —$CONH_2$; —$OCH_2CONH_2$; —$NH_2$; —$SO_2NH_2$; —$OCHF_2$; —$CF_3$; —$OCF_3$; —NH(alkyl); —N(alkyl)$_2$; —NH(aryl); —N(alkyl)(aryl); —N(aryl)$_2$; —CHO; —CO(alkyl); —CO(aryl); —$CO_2$(alkyl); and —$CO_2$(aryl); and such moieties can also be optionally substituted by a fused-ring structure or bridge, for example —$OCH_2O$—. These substituents can optionally be further substituted with a substituent selected from such groups. All chemical groups disclosed herein can be substituted, unless it is specified otherwise. For example, "substituted" alkyl, alkenyl, alkynyl, aryl, hydrocarbyl or heterocyclo moieties described herein are moieties which are substituted with a hydrocarbyl moiety, a substituted hydrocarbyl moiety, a heteroatom, or a heterocyclo. Further, substituents may include moieties in which a carbon atom is substituted with a heteroatom such as nitrogen, oxygen, silicon, phosphorus, boron, sulfur, or a halogen atom. These substituents may include halogen, heterocyclo, alkoxy, alkenoxy, alkynoxyl, aryloxy, hydroxy, protected hydroxy, keto, acyl, acyloxy, nitro, amino, amido, cyano, thiol, ketals, acetals, esters and ethers.

Platinum(II) Emitters

In embodiments of the invention, the platinum(II) emitters having the chemical structures of Structure I:

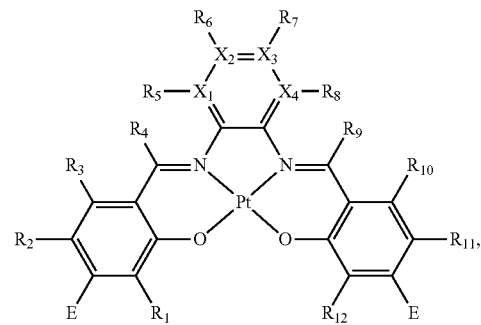

where Pt has an oxidation state of II complexed to a tetradentate ligand where: $X_1$-$X_4$ are independently carbon, nitrogen, silicon or phosphorous; $R_1$-$R_{12}$ are independently selected from hydrogen, halogen, hydroxyl, unsubstituted alkyl, substituted alkyl, cycloalkyl, unsubstituted aryl, substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or alkoxycarbonyl; and E is an emission intensity enhancement group comprising an aromatic group conjugated to the ligand's phenyl groups, where adjacent $R_1$-$R_{12}$ and E groups can independently form a 5-8 member ring.

In an embodiment of the invention, E of the Pt(II) complex is

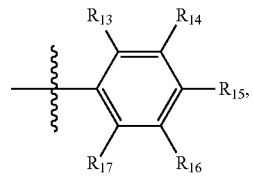

wherein $R_{13}$-$R_{17}$ are independently unsubstituted alkyl, a substituted alkyl, cycloalkyl, an unsubstituted aryl, a substituted aryl, alkoxy or amino group.

In another embodiment of the invention, E of the Pt(II) complex is

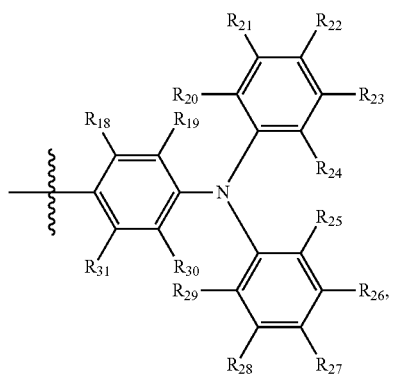

wherein $R_{18}$ and $R_{31}$ are independently hydrogen, methyl, isopropyl or phenyl group; $R_{19}$-$R_{30}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group. Each pair of adjacent R groups of $R_{19}$-$R_{30}$ can independently form 5-8 member ring(s).

In an embodiment of the invention the $R_1$, $R_2$ $R_{11}$ and $R_{12}$ of the Pt(II) complex are not amino or a portion of a substituted nitrogen heterocyclic aromatic where the nitrogen is bonded to the aromatic ring.

The platinum(II) emitters according to embodiments of the invention are as follows:

Emitter 101

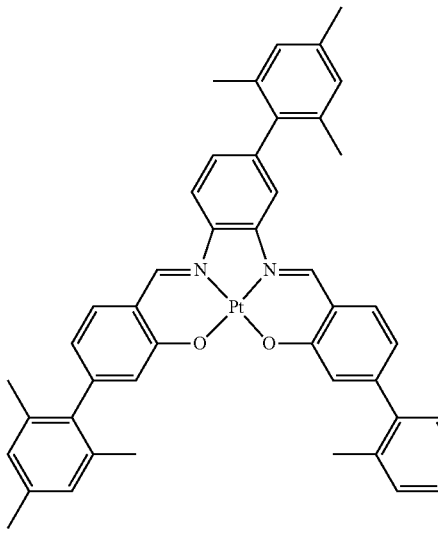

Emitter 102

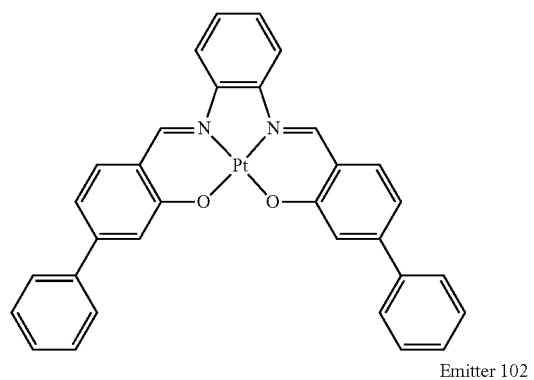

Emitter 103

Emitter 104

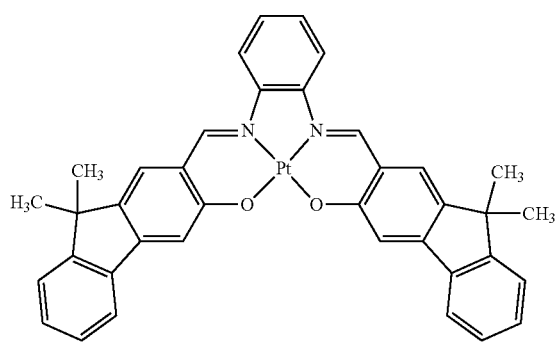

Emitter 105

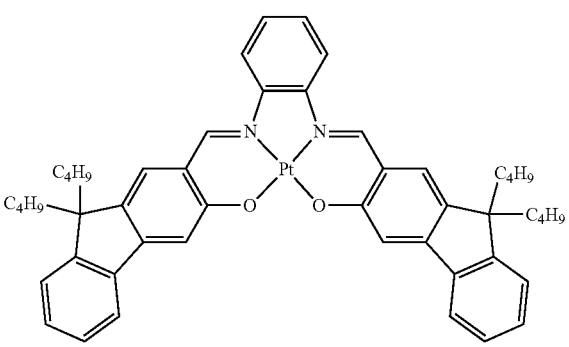

Emitter 106

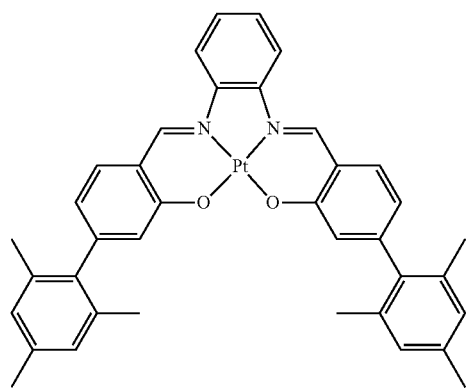

Emitter 107
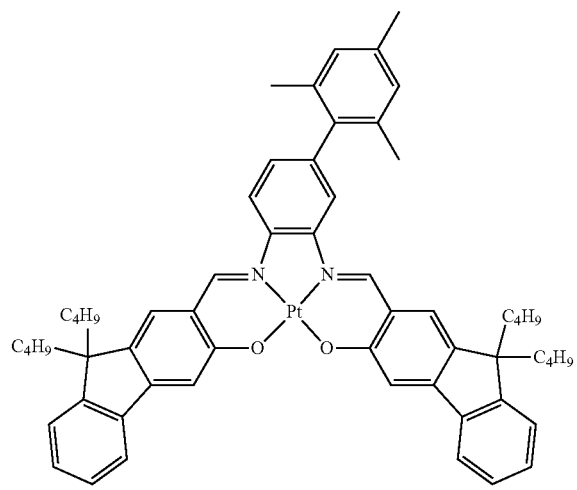
Emitter 108
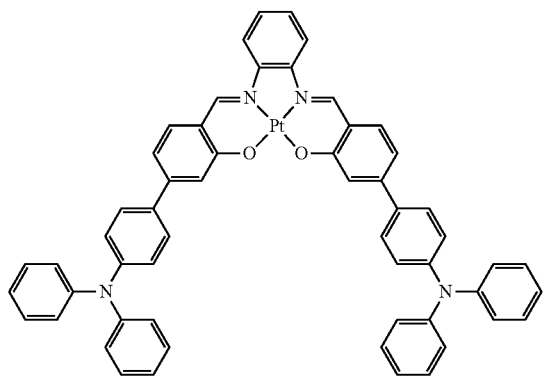
Emitter 109
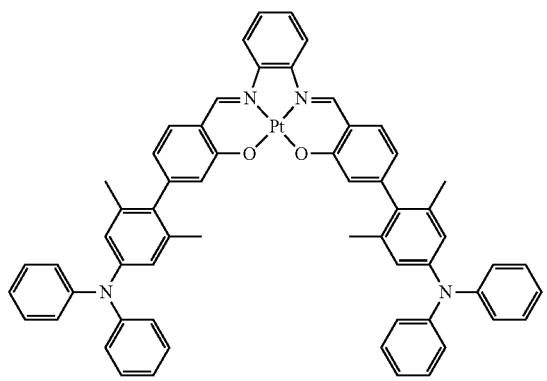
Emitter 110
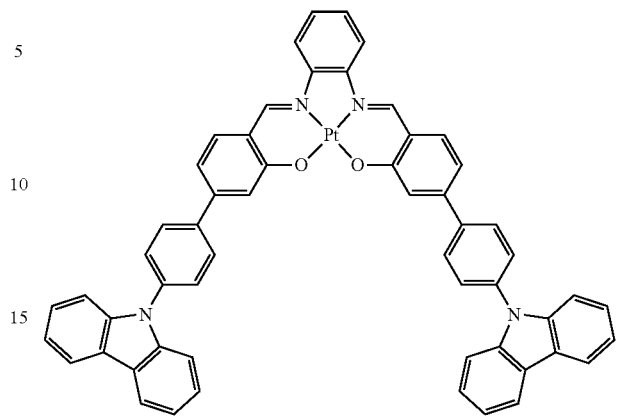
Emitter 111
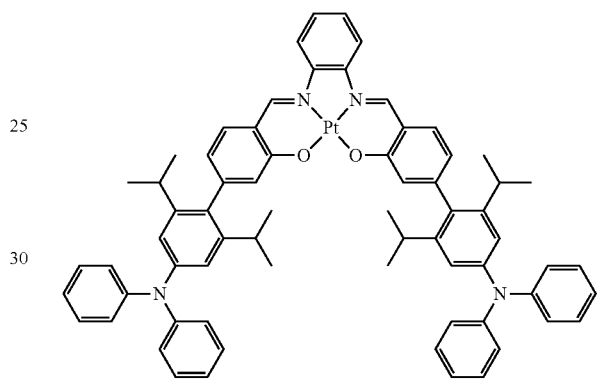
Emitter 112
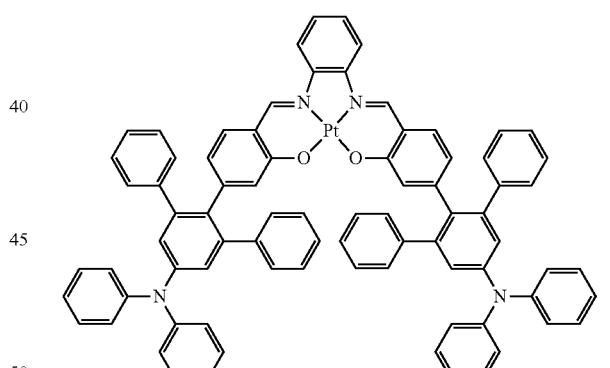
Emitter 113
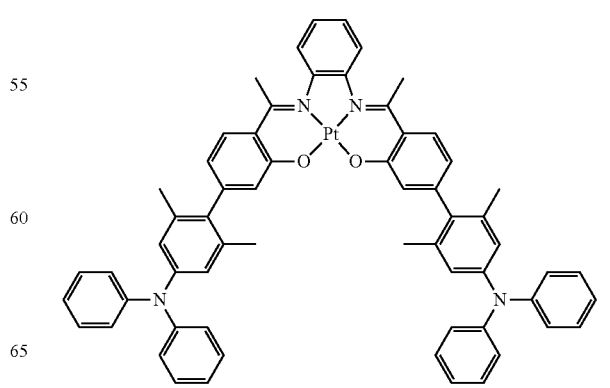

Emitter 114
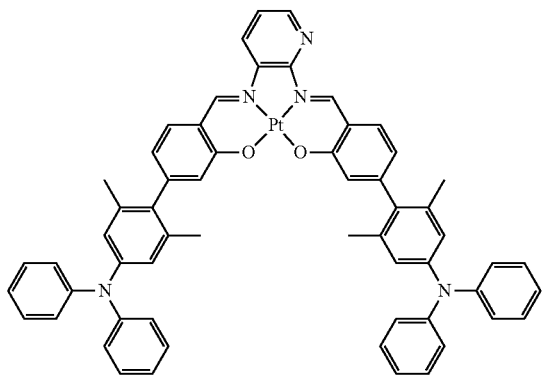
Emitter 115
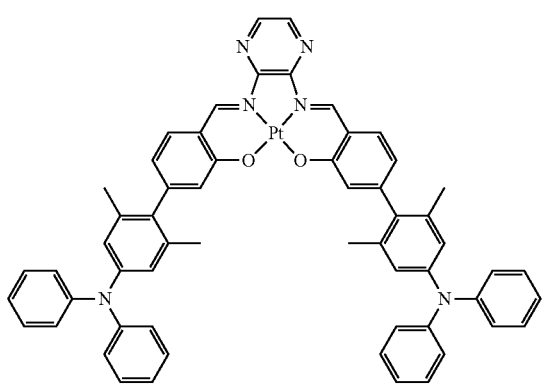
Emitter 116
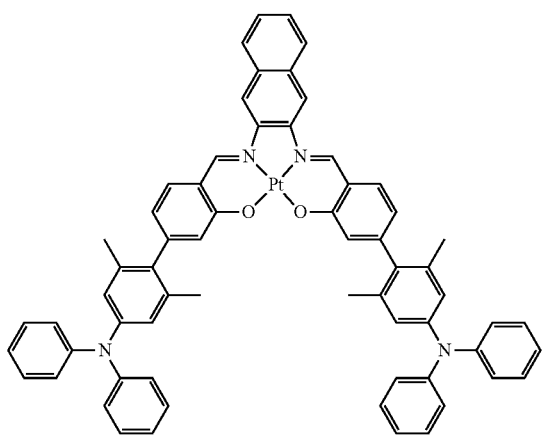
Emitter 117
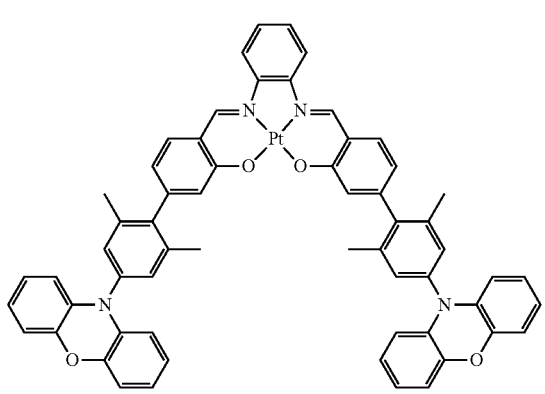
Emitter 118
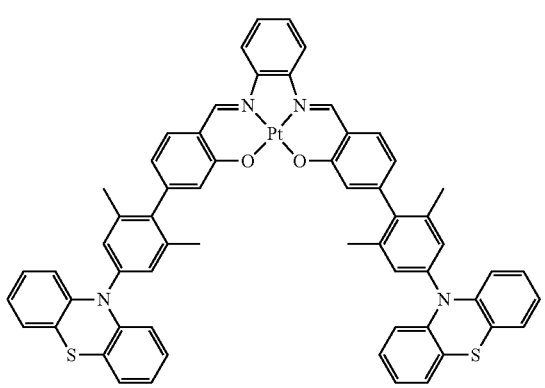
Emitter 119
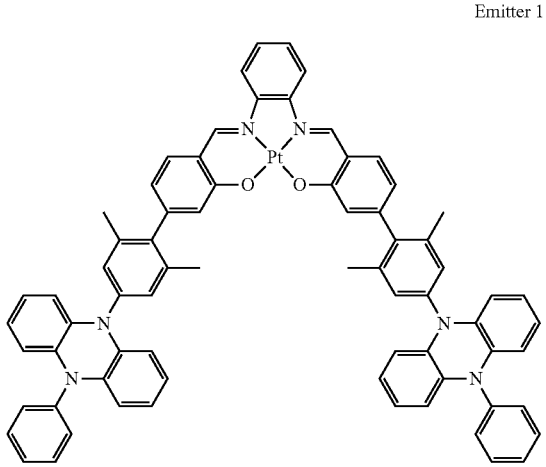
Emitter 120
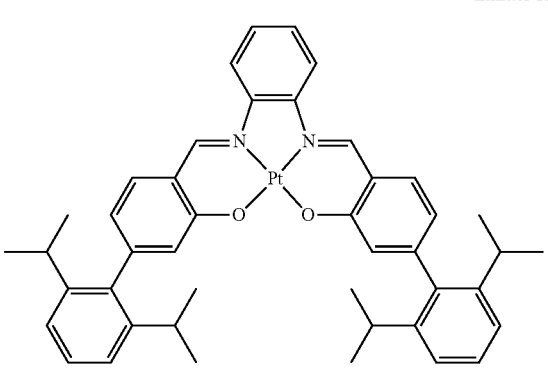
Emitter 121
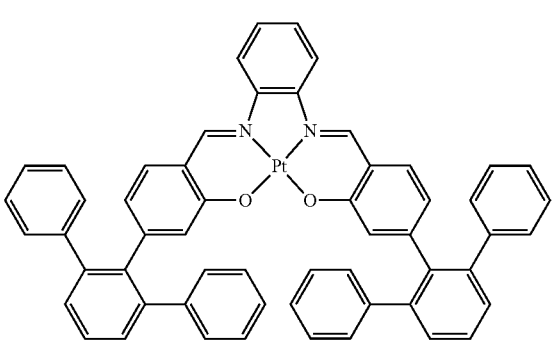

Emitter 122

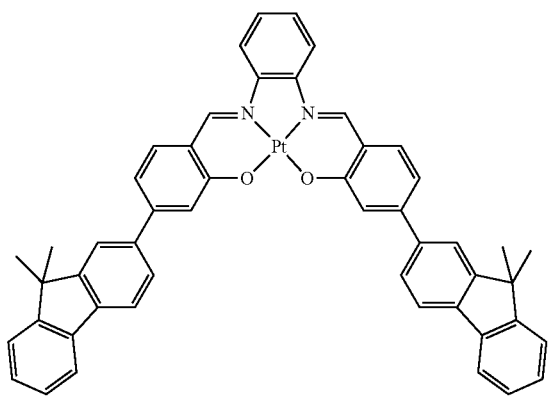

An embodiment of the invention is directed to a Schiff base ligand of structure II:

Structure II

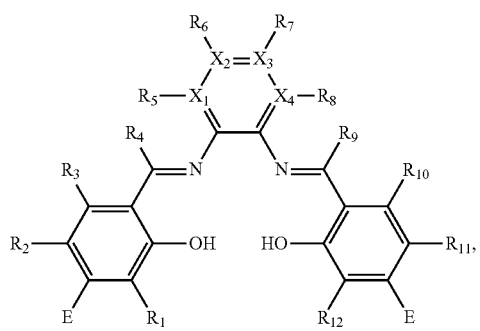

where: $X_1$-$X_4$ are independently carbon, nitrogen, silicon or phosphorous; $R_1$-$R_{12}$ are independently selected from hydrogen, halogen, hydroxyl, unsubstituted alkyl, substituted alkyl, cycloalkyl, unsubstituted aryl, substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or alkoxycarbonyl; and E is an emission intensity enhancement group comprising an aromatic group conjugated to the ligand's phenyl groups, where adjacent $R_1$-$R_{12}$ and E groups can independently form a 5-8 member ring.

In an embodiment of the invention, E of the Schiff base tetradentate ligand is

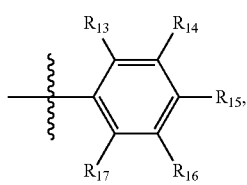

wherein $R_{13}$-$R_{17}$ are independently unsubstituted alkyl, a substituted alkyl, cycloalkyl, an unsubstituted aryl, a substituted aryl, alkoxy or amino group.

In another embodiment of the invention, E of the Schiff base tetradentate ligand is

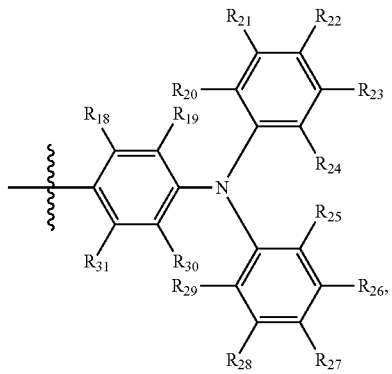

wherein $R_{18}$ and $R_{31}$ are independently hydrogen, methyl, isopropyl or phenyl group; $R_{19}$-$R_{30}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group. Each pair of adjacent R groups of $R_{19}$-$R_{30}$ can independently form 5-8 member ring(s).

In an embodiment of the invention the $R_1$, $R_2$ $R_{11}$ and $R_{12}$ of the Schiff base tetradentate ligand are not amino or a portion of a substituted nitrogen heterocyclic aromatic where the nitrogen is bonded to the aromatic ring.

Preparation of Emitters

In an embodiment of the invention, the platinum (II) emitter with chemical structure of Structure I can be prepared by reaction of the corresponding ligand of Structure II with a platinum salt in the presence of suitable solvent(s) and under suitable conditions.

Materials and Methods

Following are examples that illustrate embodiments for practicing the invention. These examples should not be construed as limiting. All percentages are by weight and all solvent mixture proportions are by volume unless otherwise noted.

Example 201—General Procedures for Preparation of Platunum (II) Emitters

A mixture of the Schiff base ligand (1 equiv) and sodium acetate (2 equiv) is dissolved in minimum amount of hot DMF. Potassium tetrachloroplatinate (1 equiv) in hot DMSO is added and the reaction mixture maintained at 80° C. overnight.

If precipitate forms, it is collected via filtration, recrystallized in hot DMF and washed with $CH_2Cl_2$. If no precipitate forms, solvent is removed under reduced pressure. Water is added to the reaction mixture and extracted with $CH_2Cl_2$. The crude product was purified by chromatography on alumina column ($CH_2Cl_2$/hexane). Further purification by recrystallization in hexane is carried out if necessary.

Example 202—Preparation of Emitter 101

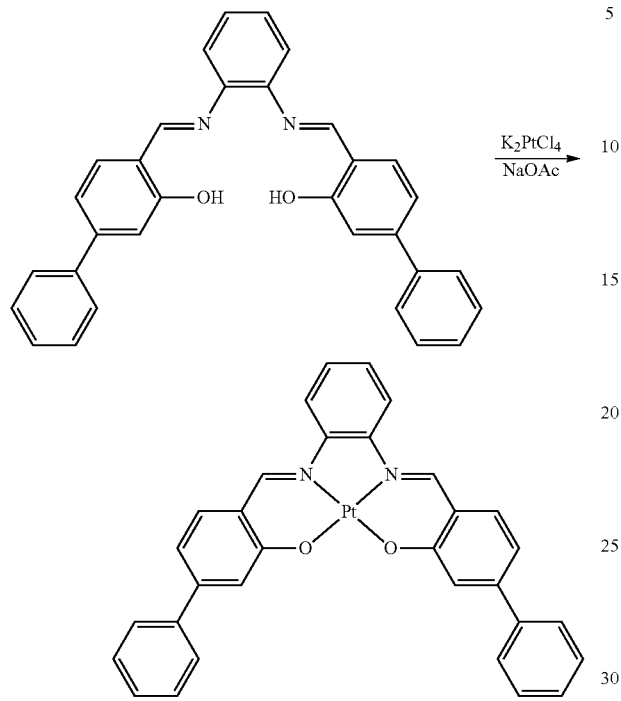

The synthetic method in Example 201 was adopted. The crude product was purified by chromatography on an alumina column (CH$_2$Cl$_2$/hexane=1:1). Further purification was carried out by recrystallization in hexane. Red product was obtained in 0.06 g (46% yield).

$^1$H NMR (500 MHz, CDCl$_3$) δ 8.78 (s, 2H), 7.92 (dd, J=5.9, 3.4 Hz, 2H), 7.71 (d, J=7.1 Hz, 4H), 7.66 (d, J=0.8 Hz, 2H), 7.56 (d, J=8.3 Hz, 2H), 7.47 (t, J=7.3 Hz, 4H), 7.43 (d, J=7.1 Hz, 2H), 7.30-7.27 (m, 2H), 7.02 (dd, J=8.3, 1.3 Hz, 2H). $^{13}$C NMR (101 MHz, CDCl$_3$) δ 148.92, 148.56, 145.90, 140.90, 135.84, 129.72, 129.12, 128.31, 127.86, 121.65, 121.42, 117.12, 116.08. FIG. 1 shows a UV-vis and photoluminescent spectra of Emitter 101 in CH$_2$Cl$_2$ at 298K.

Example 203—Preparation of Emitter 102

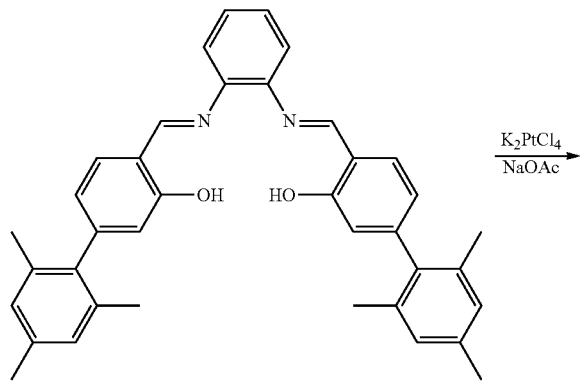

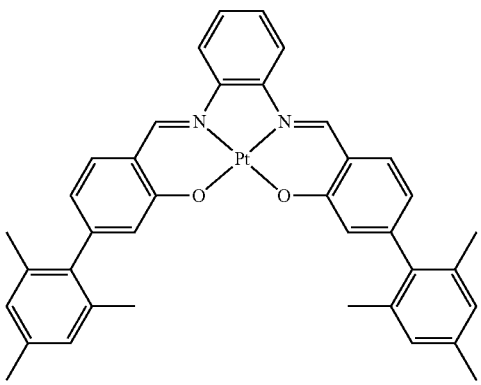

The synthetic method in Example 201 was adopted. Red precipitate was formed and was collected via filtration, recrystallized in hot DMF and washed with CH$_2$Cl$_2$. Red product was obtained in 0.16 g (71% yield).

$^1$H NMR (400 MHz, CDCl$_3$) δ 8.91 (s, 2H), 8.02 (dd, J=6.1, 3.5 Hz, 2H), 7.61 (d, J=8.2 Hz, 2H), 7.37 (dd, J=6.3, 3.2 Hz, 2H), 7.19 (s, 2H), 6.93 (s, 4H), 6.57 (d, J=8.1 Hz, 2H), 2.33 (s, 6H), 2.05 (s, 12H). $^{13}$C NMR (101 MHz, CDCl$_3$) δ 166.69, 150.32, 149.27, 146.04, 139.26, 137.59, 135.88, 135.34, 128.81, 128.42, 124.31, 121.17, 119.82, 116.05, 21.84, 21.21. FIG. 1 shows a UV-vis and photoluminescent spectra of Emitter 102 in CH$_2$Cl$_2$ at 298K.

Example 204—Preparation of Emitter 103

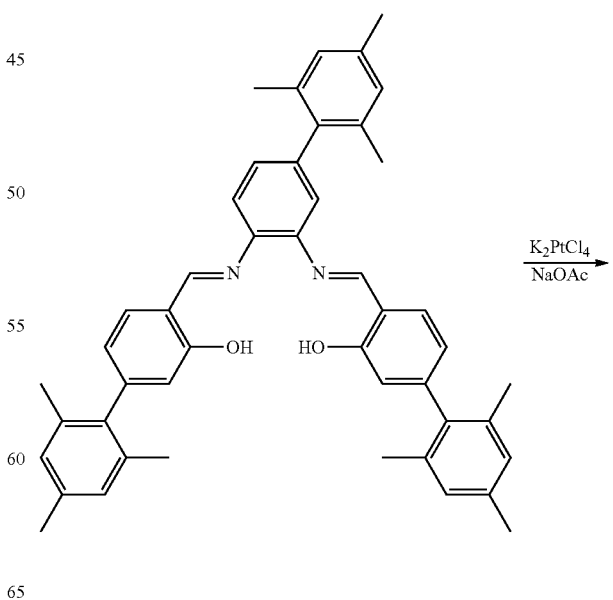

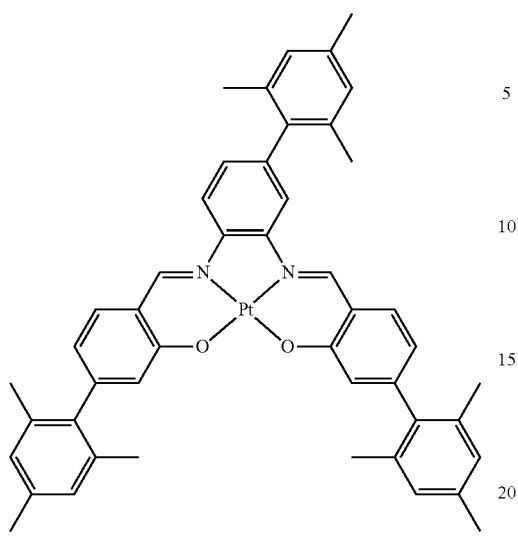

The synthetic method in Example 201 was adopted. The crude product was purified by chromatography on alumina column (CH$_2$Cl$_2$/hexane=1:1). Further purification was carried out by recrystallization in MeOH. Red product was obtained in 0.05 g (29% yield).

$^1$H NMR (500 MHz, CDCl$_3$) δ 8.93 (s, 1H), 8.85 (s, 1H), 8.06 (d, J=8.6 Hz, 1H), 7.77 (d, J=0.9 Hz, 0H), 7.62 (d, J=8.2 Hz, 1H), 7.53 (d, J=8.2 Hz, 1H), 7.19 (d, J=8.1 Hz, 3H), 7.02 (s, 2H), 6.93 (s, 2H), 6.92 (s, 2H), 6.58 (dd, J=8.2, 1.3 Hz, 1H), 6.54 (dd, J=8.2, 1.3 Hz, 1H), 2.38 (s, 3H), 2.33 (s, 3H), 2.32 (s, 3H), 2.08 (s, 6H), 2.06 (s, 6H), 2.03 (s, 6H). $^{13}$C NMR (126 MHz, CDCl$_3$) δ 165.92, 165.81, 149.55, 149.47, 148.56, 148.30, 145.43, 143.93, 141.13, 138.45, 138.44, 137.70, 136.97, 136.76, 135.89, 135.08, 135.04, 134.54, 134.49, 128.62, 128.36, 128.00, 123.47, 120.43, 120.37, 119.05, 119.01, 116.05, 115.17, 21.04, 21.03, 20.77, 20.41, 20.35. FIG. 1 shows a UV-vis and photoluminescent spectra of Emitter 103 in CH$_2$Cl$_2$ at 298K.

Example 205—Preparation of Emitter 104

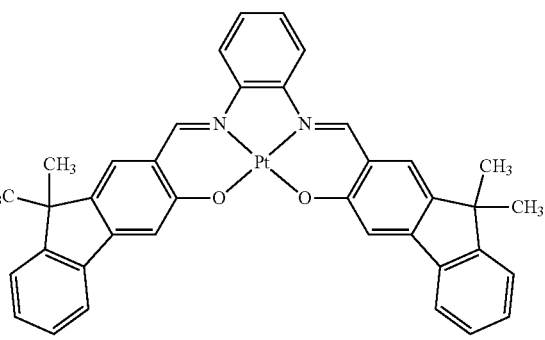

The synthetic method in Example 201 was adopted. The crude product was purified by chromatography on alumina column (CH$_2$Cl$_2$/hexane=1:4). Red product was obtained in 0.37 g (58% yield).

Figure 2:
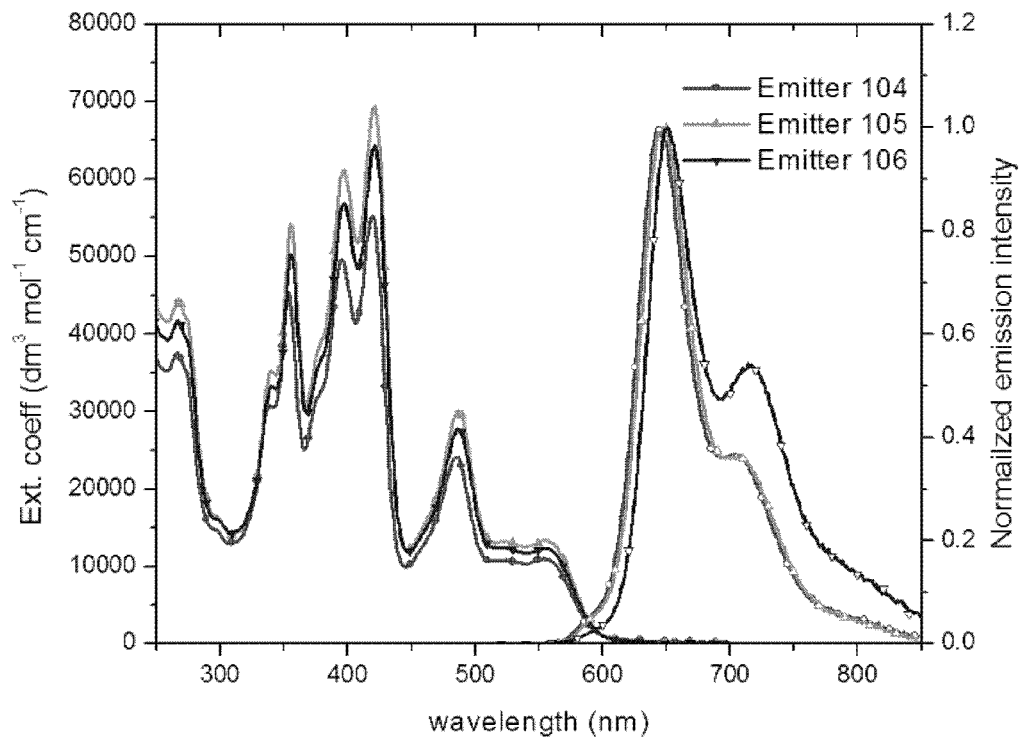
FIG. 2 shows composite UV-vis and photoluminescent spectra of Emitter 104-106 in $CH_2Cl_2$ at 298K.

$^1$H NMR (400 MHz, CDCl$_3$) δ 8.88 (s, 2H), 8.00 (dd, J=6.0, 3.2 Hz, 2H), 7.82 (d, J=7.2 Hz, 2H), 7.76 (s, 2H), 7.54 (s, 2H), 7.49-7.41 (m, 4H), 7.41-7.35 (m, 2H), 7.32 (dd, J=5.8, 3.1 Hz, 2H), 1.54 (s, 12H). FIG. 2 shows a UV-vis and photoluminescent spectra of Emitter 104 in CH$_2$Cl$_2$ at 298K.

Example 206—Preparation of Emitter 105

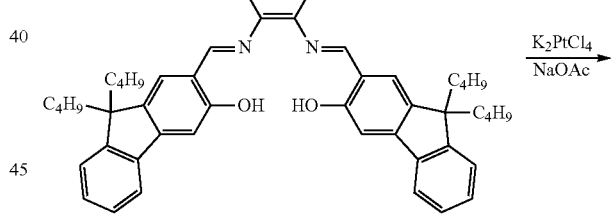

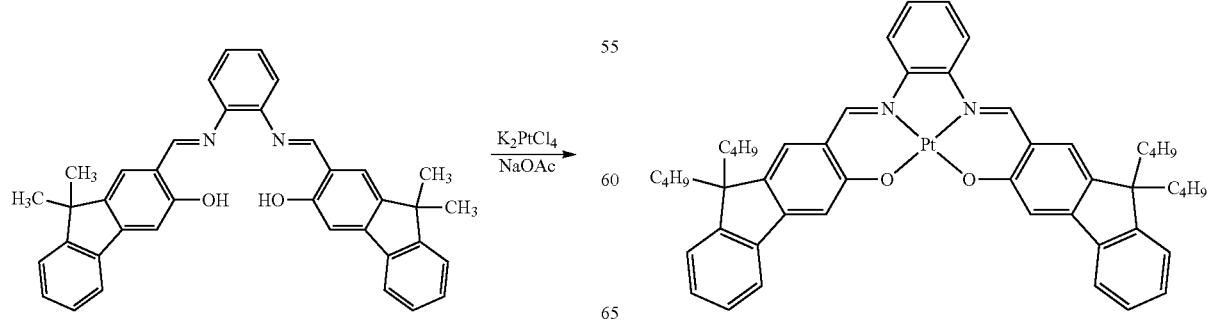

The synthetic method in Example 201 was adopted. The crude product was purified by chromatography on alumina column (CH$_2$Cl$_2$/hexane=1:4). Red product was obtained in 0.64 g (60% yield).

$^1$H NMR (300 MHz, CDCl$_3$) δ 13.39 (s, 2H), 8.73 (s, 2H), 7.80-7.66 (m, 4H), 7.45-7.28 (m, 14H), 1.96 (t, J=8.2 Hz, 8H), 1.18-0.97 (m, 8H), 0.76-0.55 (m, 20H). FIG. 2 shows a UV-vis and photoluminescent spectra of Emitter 105 in CH$_2$Cl$_2$ at 298K.

Example 207—Preparation of Emitter 106

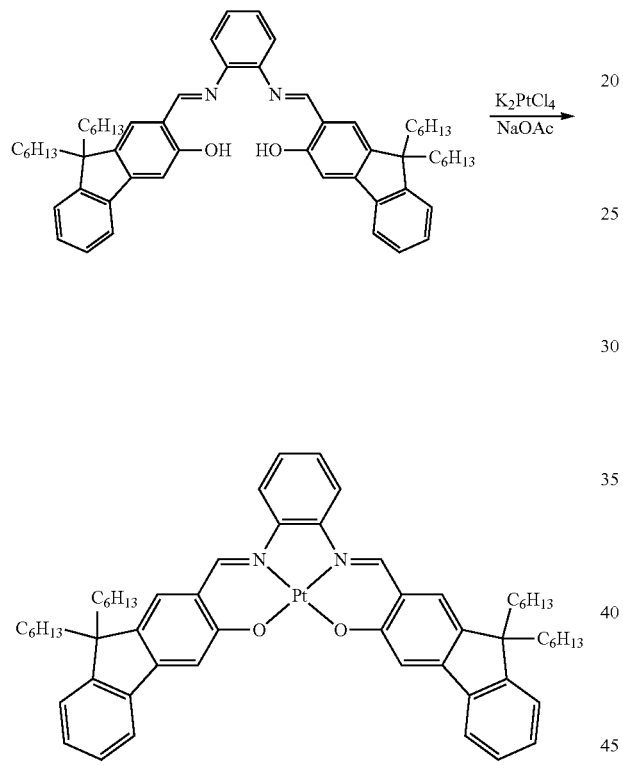

The synthetic method in Example 201 was adopted. The crude product was purified by chromatography on alumina column (CH$_2$Cl$_2$/hexane=1:4). Red product was obtained in 1.0 g (69% yield).

$^1$H NMR (400 MHz, CD$_2$Cl$_2$) δ 13.38 (s, 2H), 8.75 (s, 2H), 7.75 (s, 2H), 7.36 (m, 14H), 1.98 (t, J=7.9 Hz, 8H), 1.06 (m, 24H), 0.76 (t, J=6.7 Hz, 12H), 0.65 (d, J=20.9 Hz, 8H). FIG. 2 shows a UV-vis and photoluminescent spectra of Emitter 106 in CH$_2$Cl$_2$ at 298K.

Example 208—Preparation of Emitter 107

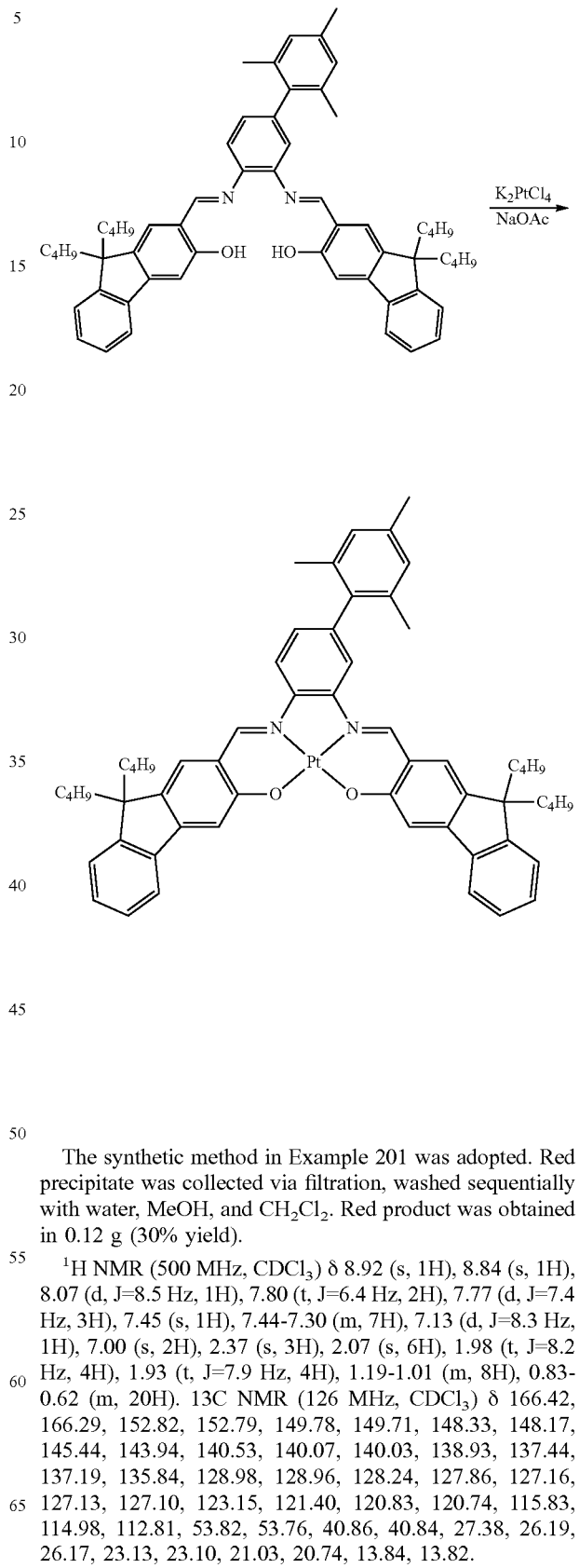

The synthetic method in Example 201 was adopted. Red precipitate was collected via filtration, washed sequentially with water, MeOH, and CH$_2$Cl$_2$. Red product was obtained in 0.12 g (30% yield).

$^1$H NMR (500 MHz, CDCl$_3$) δ 8.92 (s, 1H), 8.84 (s, 1H), 8.07 (d, J=8.5 Hz, 1H), 7.80 (t, J=6.4 Hz, 2H), 7.77 (d, J=7.4 Hz, 3H), 7.45 (s, 1H), 7.44-7.30 (m, 7H), 7.13 (d, J=8.3 Hz, 1H), 7.00 (s, 2H), 2.37 (s, 3H), 2.07 (s, 6H), 1.98 (t, J=8.2 Hz, 4H), 1.93 (t, J=7.9 Hz, 4H), 1.19-1.01 (m, 8H), 0.83-0.62 (m, 20H). 13C NMR (126 MHz, CDCl$_3$) δ 166.42, 166.29, 152.82, 152.79, 149.78, 149.71, 148.33, 148.17, 145.44, 143.94, 140.53, 140.07, 140.03, 138.93, 137.44, 137.19, 135.84, 128.98, 128.96, 128.24, 127.86, 127.16, 127.13, 127.10, 123.15, 121.40, 120.83, 120.74, 115.83, 114.98, 112.81, 53.82, 53.76, 40.86, 40.84, 27.38, 26.19, 26.17, 23.13, 23.10, 21.03, 20.74, 13.84, 13.82.

Example 209—Preparation of Emitter 108

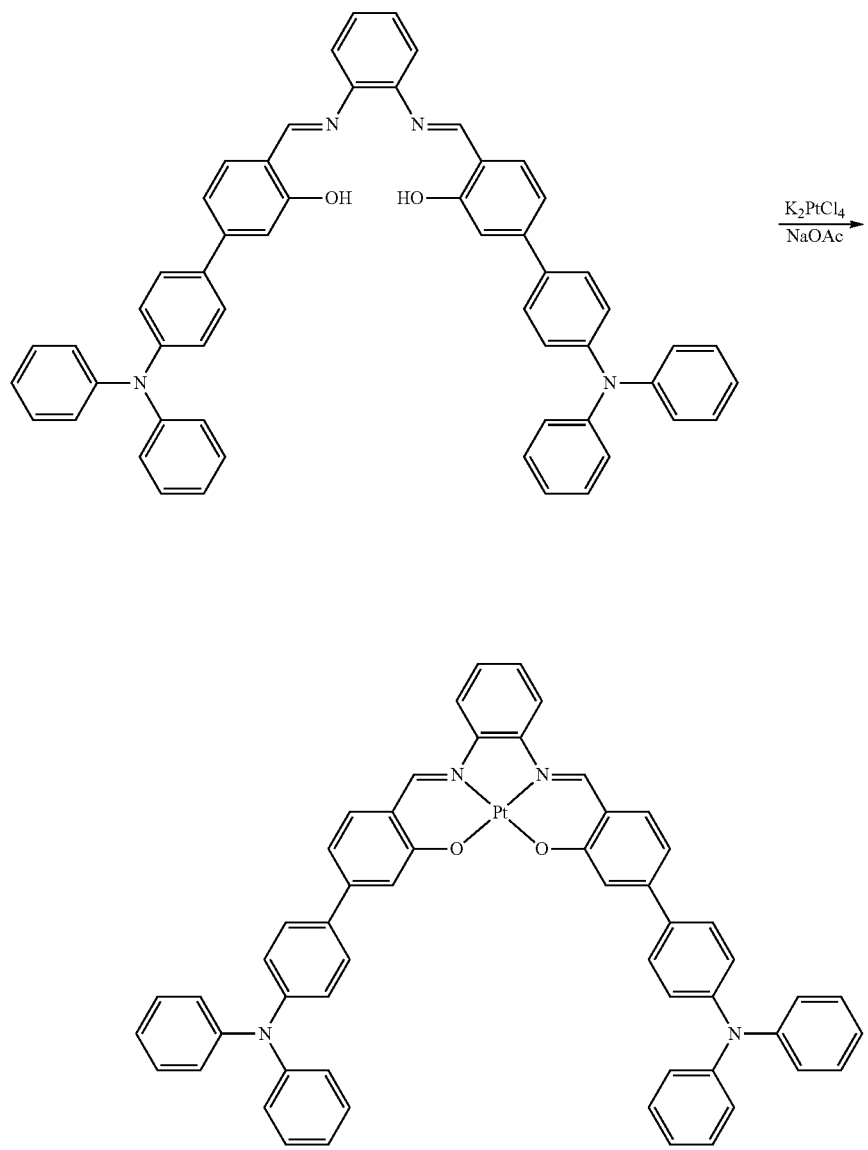

The synthetic method in Example 201 was adopted. Red precipitate was collected via filtration, re-dissolved in a large amount of $CH_2Cl_2$, and washed with water. The solution was concentrated and red precipitate was collected via filtration. Red product was obtained in 1.4 g (57% yield).

Figure 3:
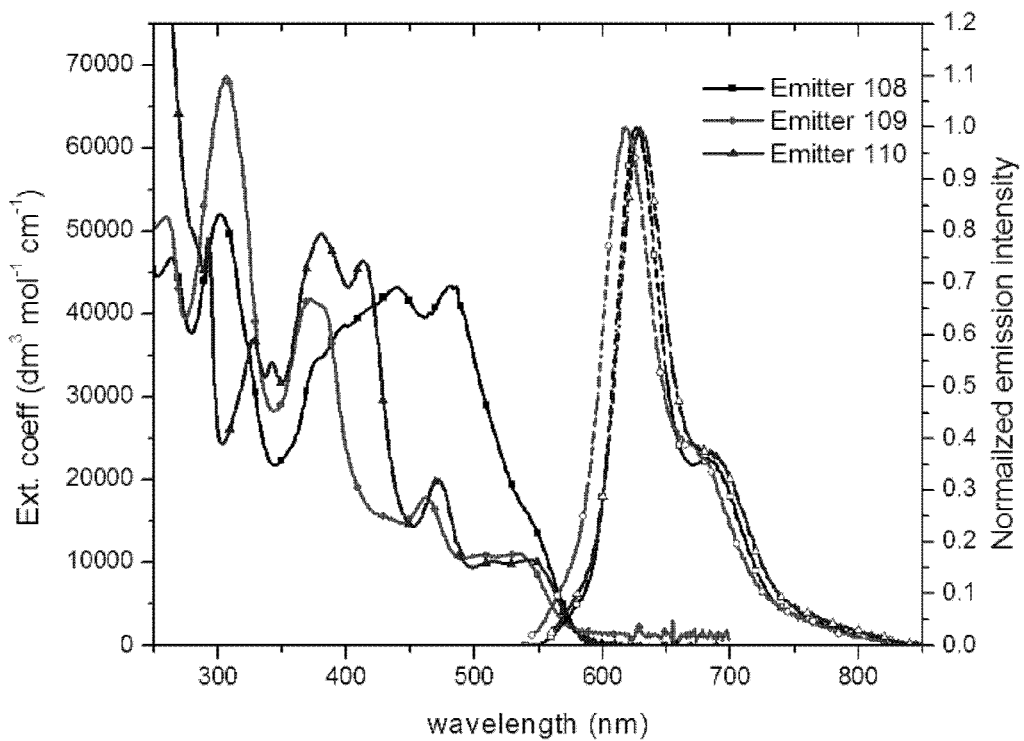
FIG. 3 shows composite UV-vis and photoluminescent spectra of Emitter 108-110 in $CH_2Cl_2$ at 298K.

$^1$H NMR (400 MHz, DMSO) δ 9.41 (s, 2H), 8.38 (s, 2H), 7.85 (d, J=8.2 Hz, 2H), 7.73 (d, J=8.1 Hz, 4H), 7.59-7.26 (m, 12H), 7.26-7.04 (m, 14H), 7.00 (d, J=8.0 Hz, 4H). $^{13}$C NMR (126 MHz, $CDCl_3$) δ 165.62, 148.18, 147.66, 147.38, 146.80, 144.93, 134.99, 133.10, 129.36, 127.68, 127.17, 124.91, 123.35, 122.97, 120.52, 119.28, 115.63, 115.15. FIG. 3 UV-vis and photoluminescent spectra of Emitter 108 in $CH_2Cl_2$ at 298K.

Example 210—Preparation of Emitter 109

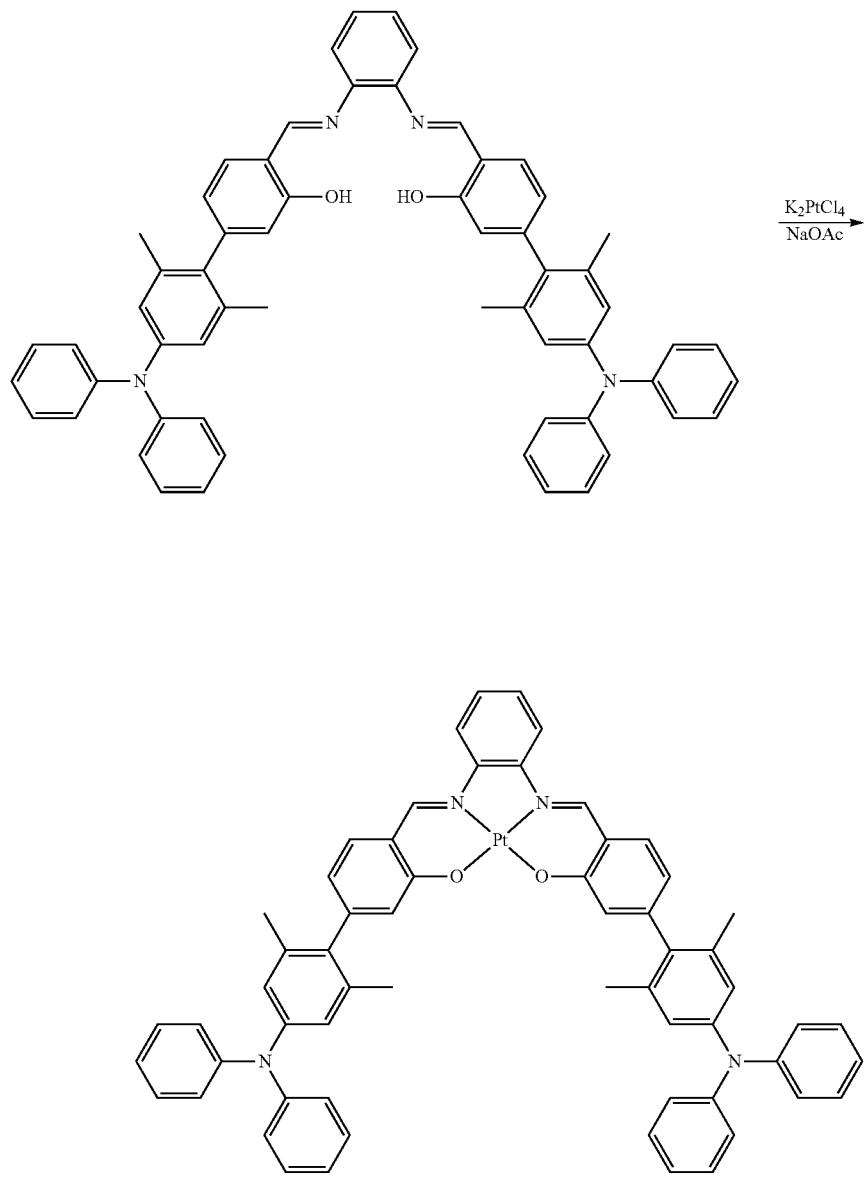

The synthetic method in Example 201 was adopted. The crude product was purified by chromatography using an alumina column and a $CH_2Cl_2$ mobile phase. Further purification was done by recrystallization in hexane. Red product was obtained in 0.05 g (70% yield).

$^1$H NMR (500 MHz, $CDCl_3$) δ 8.86 (s, 2H), 7.98 (dd, J=6.1, 3.2 Hz, 2H), 7.58 (d, J=8.2 Hz, 2H), 7.33 (dd, J=6.2, 3.2 Hz, 2H), 7.28 (t, J=7.9 Hz, 8H), 7.22 (s, 2H), 7.16 (d, J=7.7 Hz, 8H), 7.02 (t, J=7.3 Hz, 4H), 6.81 (s, 4H), 6.59 (dd, J=8.2, 1.1 Hz, 2H), 1.99 (s, 12H). $^{13}$C NMR (126 MHz, $CDCl_3$) δ 163.37, 161.39, 147.87, 146.99, 146.54, 142.82, 136.54, 135.63, 132.26, 129.14, 127.67, 124.28, 122.71, 122.52, 120.74, 119.67, 118.59, 117.87, 20.79. FIG. 3 shows UV-vis and photoluminescent spectra of Emitter 109 in $CH_2Cl_2$ at 298K.

Example 211—Preparation of Emitter 110

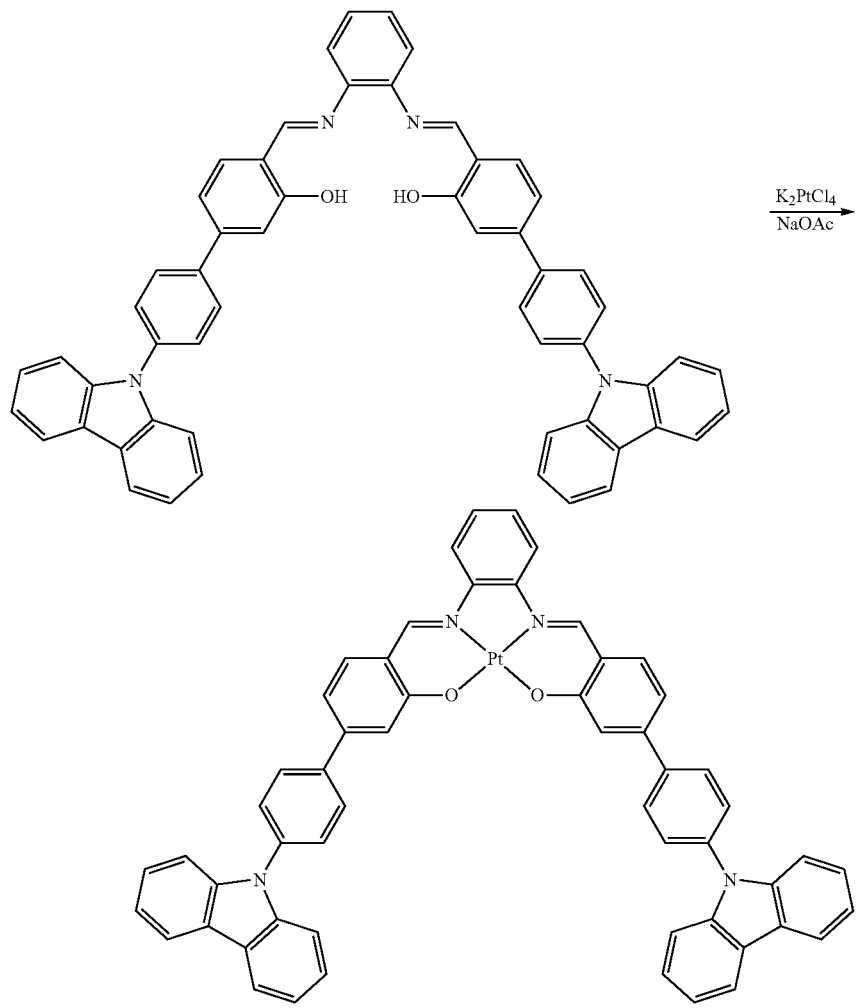

The synthetic method in Example 201 was adopted. Red precipitate was collected via filtration and washed sequentially with water, MeOH and CH$_2$Cl$_2$. Red product was obtained in 0.06 g (45% yield).

$^1$H NMR (500 MHz, CDCl$_3$) δ 8.92 (s, 2H), 8.16 (d, J=7.3 Hz, 4H), 8.02 (s, 2H), 7.96 (d, J=7.3 Hz, 4H), 7.81 (s, 2H), 7.77-7.62 (m, 6H), 7.53 (d, J=7.6 Hz, 4H), 7.44 (t, J=7.0 Hz, 4H), 7.38 (s, 2H), 7.31 (t, J=7.1 Hz, 4H), 7.16 (d, J=7.6 Hz, 2H). $^1$H NMR (500 MHz, DMSO) δ 9.58 (s, 2H), 8.48 (s, 2H), 8.25 (d, J=7.7 Hz, 4H), 8.13 (d, J=7.5 Hz, 4H), 8.02 (d, J=8.4 Hz, 2H), 7.76 (d, J=7.8 Hz, 4H), 7.55 (s, 2H), 7.53-7.39 (m, 10H), 7.35-7.21 (m, J=7.4 Hz, 6H). $^{13}$C NMR (at 370K, 126 MHz, DMSO) δ 165.59, 151.15, 146.30, 145.34, 140.88, 139.04, 137.86, 136.76, 128.90, 128.37, 127.59, 126.66, 123.58, 122.00, 120.80, 120.63, 119.14, 117.13, 115.74, 110.23. FIG. 3 shows UV-vis and photoluminescent spectra of Emitter 110 in CH$_2$Cl$_2$ at 298K.

Example 212—Photophysical Data

Figure 4:
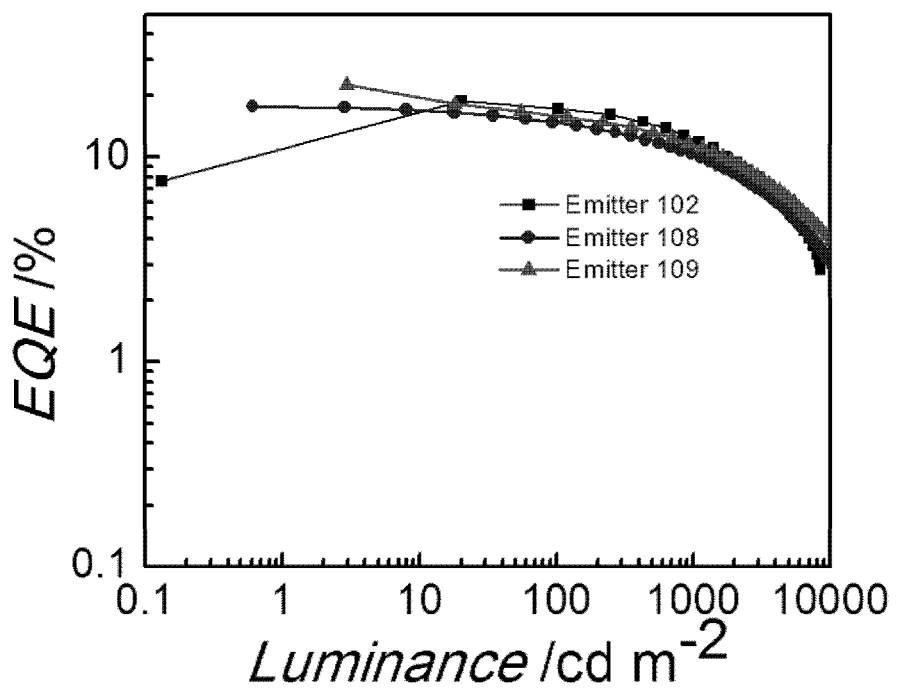
FIG. 4 shows composite EQE-luminance characteristics of Emitter 102, 108 and 109.
Figure 5:
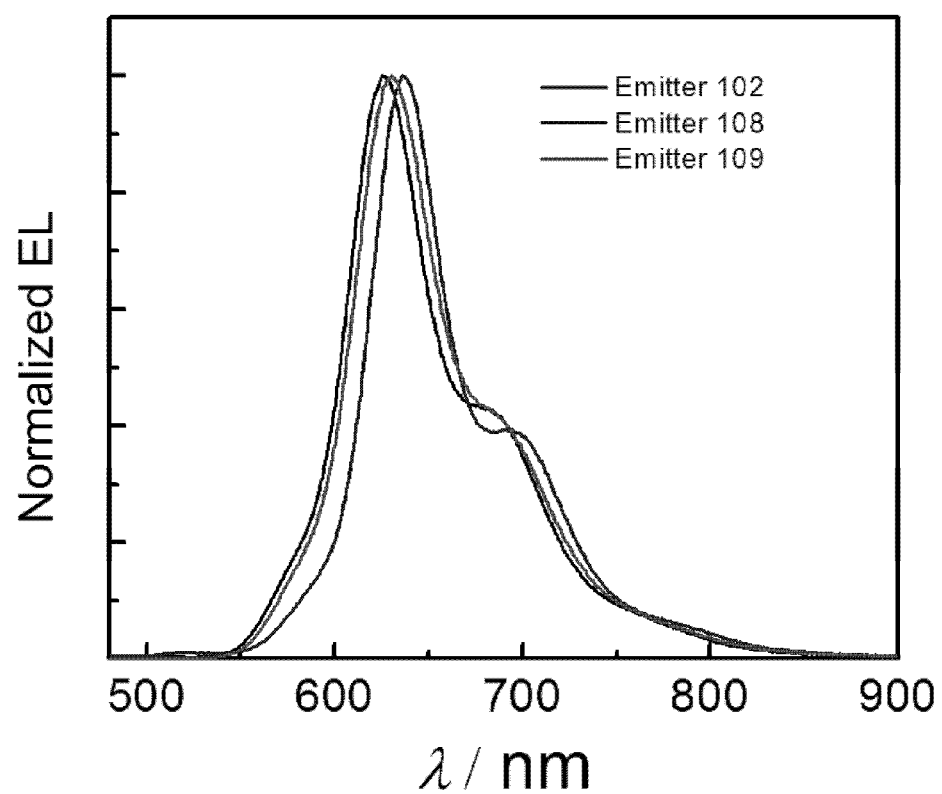
FIG. 5 shows composite electroluminescent spectra of Emitter 102, 108 and 109.

FIG. 4 shows EQE-luminance characteristics of Emitter 102, 108 and 109. FIG. 5 shows electroluminescent spectra of Emitter 102, 108 and 109.

TABLE 1

| | Photophysical data of Emitter 101-110$^a$ | | | | | |
|---|---|---|---|---|---|---|
| Emitter | $\lambda_{abs}$ [nm] (ε [mol$^{-1}$ dm$^3$ cm$^{-1}$]) | $\lambda_{em}$ [nm] | τ [μs] | $\Phi_{em}^{[b]}$ | $k_r$[10$^4$ s$^{-1}$] | $k_{nr}$[10$^4$ s$^{-1}$] |
| 101 | 260 (53800), 337 (45400), 383 (44200), 405 (46700), 470 (15700), 540 (10300), | 629, 690sh | 4.1 | 0.38 | 9.3 | 15.1 |

TABLE 1-continued

Photophysical data of Emitter 101-110[a]

| Emitter | $\lambda_{abs}$ [nm] ($\varepsilon$ [mol$^{-1}$ dm$^3$ cm$^{-1}$]) | $\lambda_{em}$ [nm] | $\tau$ [µs] | $\Phi_{em}$[b] | $k_r$[10$^4$ s$^{-1}$] | $k_{nr}$[10$^4$ s$^{-1}$] |
|---|---|---|---|---|---|---|
| 102 | 258 (48300), 324 (28400), 370 (41000), 391 (39600), 460 (11600), 535(9100) | 617, 676sh | 5.7 | 0.45 | 8.7 | 8.8 |
| 103 | 260 (68500), 327 (39000), 371 (43500), 391 (43200), 462 (13000), 535 (10800) | 618, 674sh | 6.4 | 0.43 | 6.7 | 8.9 |
| 104 | 266 (37700), 339 (30800), 354 (45400), 395 (49700), 411 (55200), 487 (24100), 521 (10900), 551 (11000) | 642 | 4.2 | 0.43 | 8.9 | 14.9 |
| 105 | 267 (44500), 340 (35300), 355 (54200), 397 (61200), 421 (69400), 487 (30200), 524sh (13200), 556 (13300) | 648, 714sh | 4.4 | 0.44 | 10.9 | 11.8 |
| 106 | 241 (47400), 267 (41800), 339 (33100), 356 (50300), 397 (56800), 421 (64300), 486 (27800), 555 (12300) | 649 | 4.0 | 0.44 | 10.7 | 14.3 |
| 107 | 268 (49900), 341 (39500), 357 (60700), 398 (64800), 420 (66900), 488 (30400), 557 (15500) | 650, 714sh | 4.3 | 0.45 | 10.5 | 12.8 |
| 108 | 264 (46800), 302 (52000), 377sh (34500), 399sh (38700), 441 (43200), 482 (43300), 545sh (14900) | 627, 682 | 4.1 | 0.46 | 11.2 | 13.2 |
| 109 | 260 (51800), 306 (68700), 372 (41800), 383sh (40800), 462 (17900), 531 (11100) | 618, 676sh | 5.3 | 0.49 | 9.2 | 9.6 |
| 110 | 293 (49300), 328 (36900), 342 (34300), 381 (49700), 413 (46500), 471 (20000), 514 (10100), 543 (10300) | 629, 691 | 4.1 | 0.41 | 10.0 | 14.4 |

[a]Measured in dichloromethane solution at 2 × 10$^{-5}$M.
[b]Measured by integration sphere.
sh denotes shoulder of emission band.

The above data demonstrate red-emitting Pt(II) Schiff base complex of Structure I having a emission intensity enhancement group, E, display high $\Phi_{em}$ greater than 0.38.

Example 213—OLED Fabrication Procedures

Materials: PEDOT:PSS [poly(3,4-ethylenedioxythiophene):poly(styrene sulfonic acid)](Clevios P AI 4083) was purchased from Heraeus, PVK (polyvinylcarbazole) from Sigma-Aldrich, OXD-7 [(1,3-bis[(4-tert-butylphenyl)-1,3,4-oxadiazolyl]phenylene)], and TPBi [2,2',2"-(1,3,5-benzenetriyl)-tris(1-phenyl-1-H-benzimidazole)] from Luminescence Technology Corp. All of the materials were used as received.

Substrate cleaning: Glass slides with pre-patterned ITO electrodes used as substrates of OLEDs were cleaned in an ultrasonic bath of Decon 90 detergent and deionized water, rinsed with deionized water, and then cleaned in sequential ultrasonic baths of deionized water, acetone, and isopropanol, and subsequently dried in an oven for 1 h.

Fabrication and characterization of devices: PEDOT:PSS were spin-coated onto the cleaned ITO-coated glass substrate and baked at 120° C. for 20 minutes to remove the residual water solvent in a clean room. Blends of emitting layer were spin-coated from chlorobenzene atop the PEDOT:PSS layer inside a N$_2$-filled glove box. The thickness for all EMLs was about 60 nm. Afterwards, the were annealed at 110° C. for 10 min inside the glove box and subsequently transferred into a Kurt J. Lesker SPECTROS vacuum deposition system without exposing to air. Finally, TPBi (40 nm), LiF (1.2 nm), and Al (100 nm) were deposited in sequence by thermal evaporation at a pressure of 10$^{-8}$ mbar. EQE, PE, CE, and CIE coordinates were measured using a Keithley 2400 source-meter and an absolute external quantum efficiency measurement system (C9920-12, Hamamatsu Photonics). All devices were characterized at room temperature without encapsulation. EQE and power efficiency were calculated by assuming a Lambertian distribution.

Example 214—Key Performance Data of Solution-Processed OLED

TABLE 2

Data of Solution-processed OLED Fabricated with Emitter 102, 108, and 109.

| Emitter | % Conc | $L_{max}$ (cd m$^{-2}$) | $CE_{max}$ (cd/A) | $PE_{max}$ (lm/W) | $EQE_{max}$ (%) | CIE (x, y) |
|---|---|---|---|---|---|---|
| 102 | 2 | 8430 | 19.32 | 20.34 | 18.77 | 0.65, 0.35 |
| 108 | 2 | 11300 | 12.29 | 14.85 | 17.69 | 0.67, 0.32 |
| 109 | 3 | 14600 | 19.07 | 23.04 | 22.49 | 0.66, 0.34 |

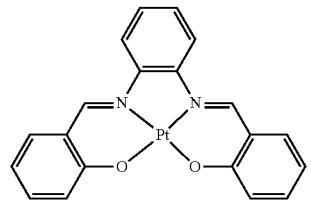

model complex 1

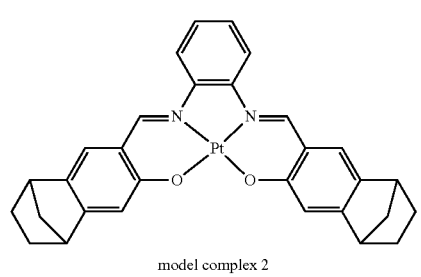

model complex 2

Table 3 compares model complex 1 and model complex 2, having no E group, to Emitter 102, 108 and 110 in terms of $\Phi_{em}$ in solution, maximum CE, PE and EQE as well as CIE of the corresponding devices. As can been seen, Emitter 102, 108 and 110 exhibit superior $\Phi_{em}$, maximum CE, PE and EQE resulting from the existence of E group at the specified position.

TABLE 3

Comparison PL and EL data of model complex and Emitter 102, 108, and 109.

| Emitter | $\lambda_{em}$ (nm)$^a$ | $\lambda_{em}^a$ | $CE_{max}$ (cd/A) | $PE_{max}$ (lm/W) | % $EQE_{max}$ | CIE (x, y) |
|---|---|---|---|---|---|---|
| model complex 1$^b$ | 618 | 0.20 | 10.80 | 4.9 | 9.4 | 0.65, 0.35 |
| model complex 2$^c$ | 624 | 0.20 | 10.82 | 9.00 | 7.02 | 0.61, 0.38 |
| 102 | 617 | 0.45 | 19.32 | 20.34 | 18.77 | 0.65, 0.35 |
| 108 | 627 | 0.46 | 12.29 | 14.85 | 17.69 | 0.67, 0.32 |
| 109 | 629 | 0.49 | 19.07 | 23.04 | 22.49 | 0.66, 0.34 |

$^a$Measured in CH$_2$Cl$_2$ at room temperatue.
$^b$Chem. Eur. J., 2010, 16, 233.
$^c$Chem. Asian. J., 2014, 9, 2984.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

It should be understood that the examples and embodiments described herein are for illustrative purposes only and that various modifications or changes in light thereof will be suggested to persons skilled in the art and are to be included within the spirit and purview of this application.

It should be understood that the examples and embodiments described herein are for illustrative purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

All patents, patent applications, provisional applications, and publications referred to or cited herein are incorporated by reference in their entirety, including all figures and tables, to the extent they are not inconsistent with the explicit teachings of this specification.

Following are examples that illustrate procedures for practicing the invention. These examples should not be construed as limiting. All percentages are by weight and all solvent mixture proportions are by volume unless otherwise noted.

We claim:
1. An OLED emitter having a chemical structure of Structure I:

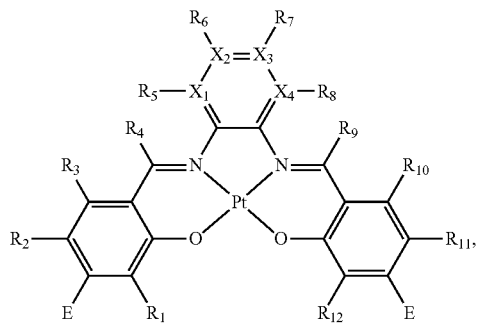

Structure I where Pt is in the oxidation state of II complexed to a tetradentate ligand where: $X_1$-$X_4$ are independently carbon, nitrogen, silicon or phosphorous; $R_1$-$R_{12}$ are independently selected from hydrogen, halogen, hydroxyl, unsubstituted alkyl, substituted alkyl, cycloalkyl, unsubstituted aryl, substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or alkoxycarbonyl; and E is an emission intensity enhancement group comprising an aromatic group conjugated to the ligand's phenyl groups, or where adjacent $R_1$-$R_{12}$ and E groups are independently combined in a 5-8 member ring, and $R_1$, $R_2$, $R_{11}$ and $R_{12}$ are not amino or a portion of a substituted nitrogen heterocyclic aromatic,
wherein E group is:

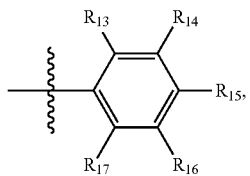

where $R_{13}$-$R_{17}$ are independently unsubstituted alkyl, substituted alkyl, cycloalkyl, unsubstituted aryl, substituted aryl, alkoxy or amino group, or where adjacent $R_{13}$-$R_{17}$ are independently combined in a 5-8 member ring, or
wherein E group is:

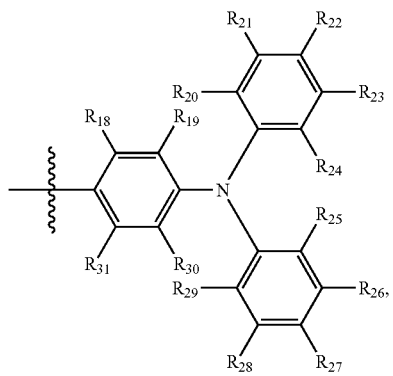

where $R_{18}$ and $R_{31}$ are independently hydrogen, methyl, isopropyl or phenyl group; $R_{19}$-$R_{30}$ are independently hydrogen, halogen, hydroxyl, unsubstituted alkyl, substituted alkyl, cycloalkyl, an unsubstituted aryl, substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or alkoxycarbonyl group; or where adjacent $R_{18}$-$R_{30}$ are independently combined in a 5-8 member ring.

2. The OLED emitter of claim 1, wherein $R_1$-$R_{12}$ are independently hydrogen, halogen, hydroxyl, unsubstituted alkyl containing 1 to 10 carbon atoms, substituted alkyl containing 1 to 20 carbon atoms, cycloalkyl containing 4 to 20 carbon atoms, unsubstituted aryl containing 6 to 20 carbon atoms, substituted aryl containing 6 to 20 carbon atoms, acyl containing 1 to 20 carbon atoms, alkoxy containing 1 to 20 carbon atoms, acyloxy containing 1 to 20 carbon atoms, amino, nitro, acylamino containing 1 to 20 carbon atoms, aralkyl from 7 to 20 carbon atoms, cyano, carboxyl containing 1 to 20 carbon atoms, thiol, styryl, aminocarbonyl containing 1 to 20 carbon atoms, carbamoyl containing 1 to 20 carbon atoms, aryloxycarbonyl containing 7 to 20 carbon atoms, phenoxycarbonyl containing from 1 to 20 carbon atoms, or an alkoxycarbonyl group containing from 1 to 20 carbon atoms.

3. The OLED emitter of claim 1, wherein the emitter comprises at least one selected from Emitter 101-Emitter 122:

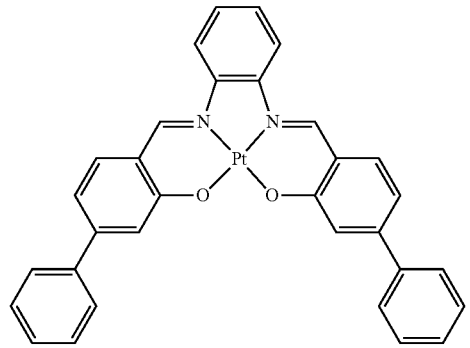

Emitter 101

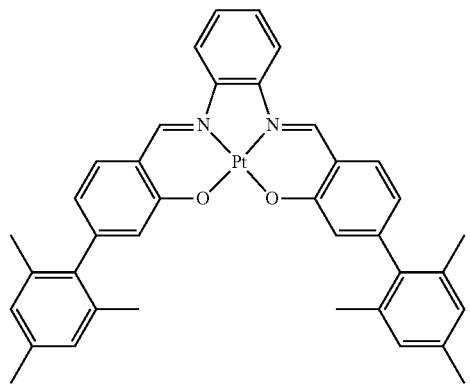

Emitter 102

Emitter 103
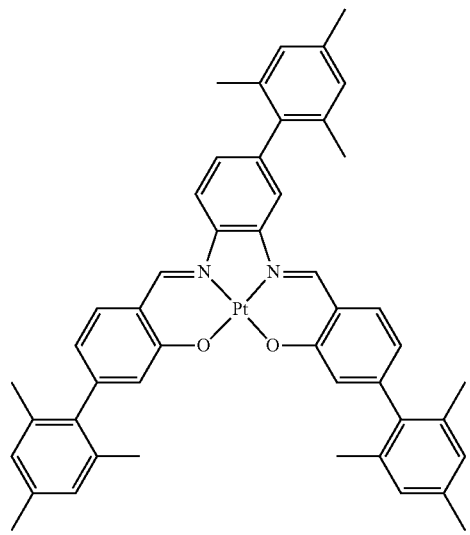
Emitter 104
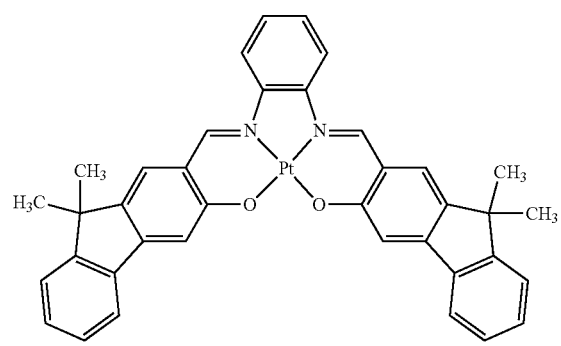
Emitter 105
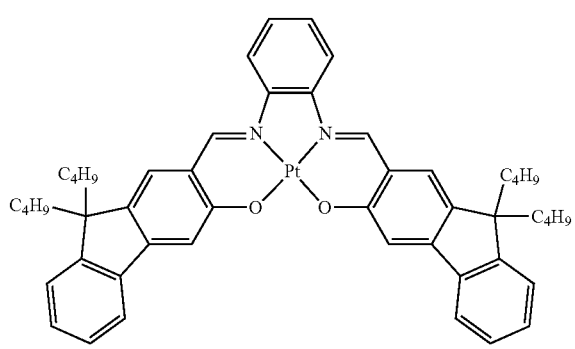
Emitter 106
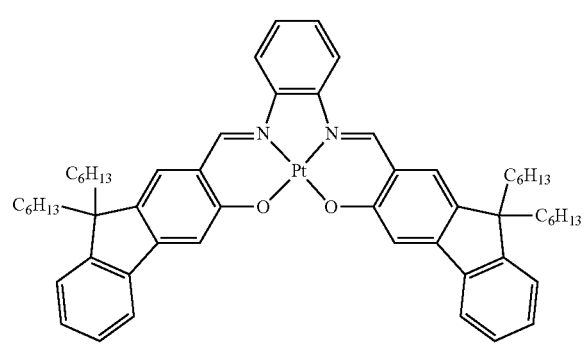
Emitter 107
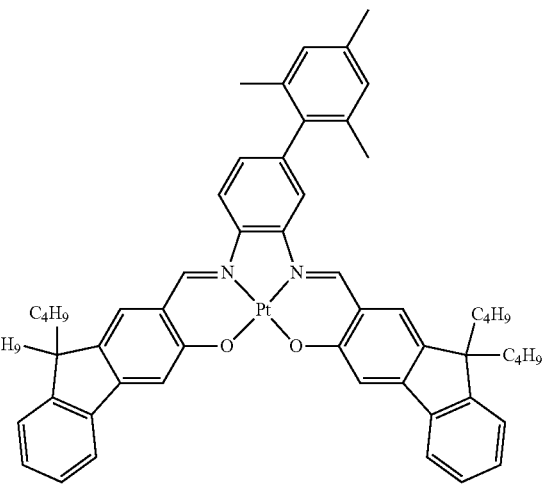
Emitter 108
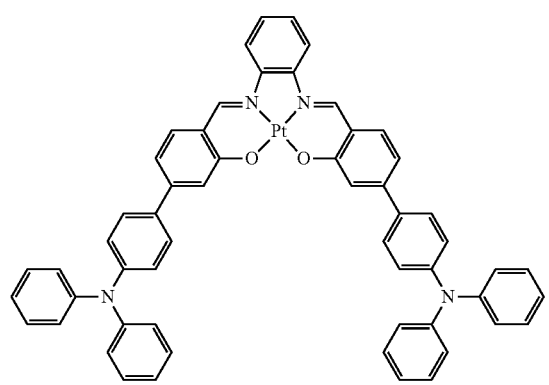
Emitter 109
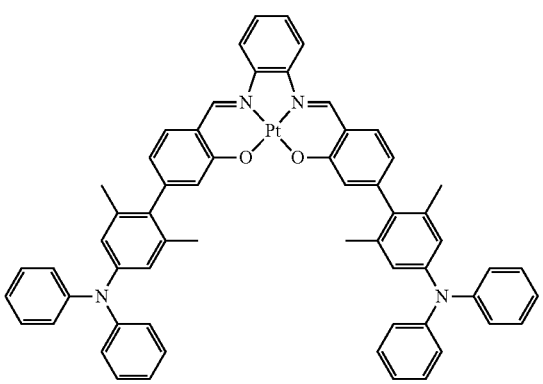

Emitter 110
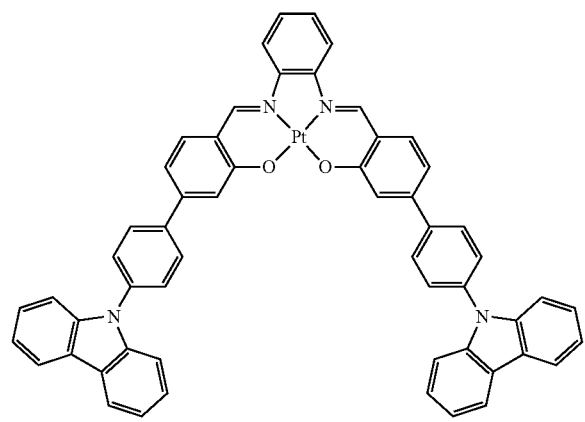
Emitter 111
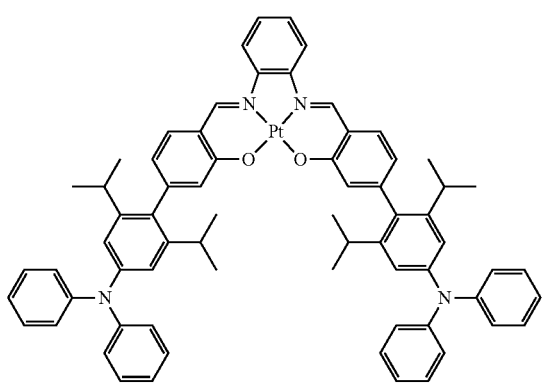
Emitter 112
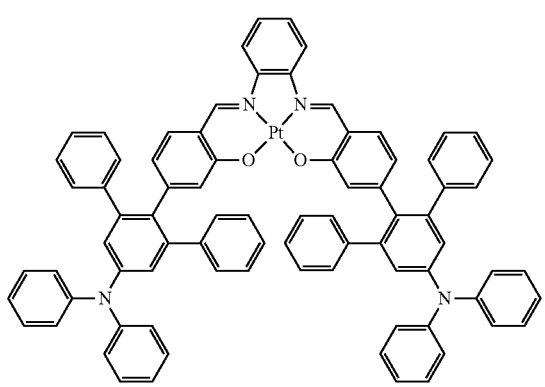
Emitter 114
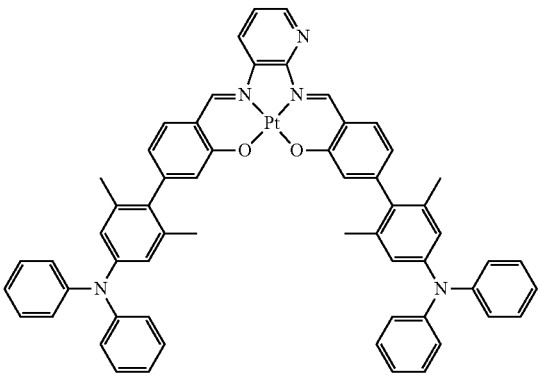
Emitter 115
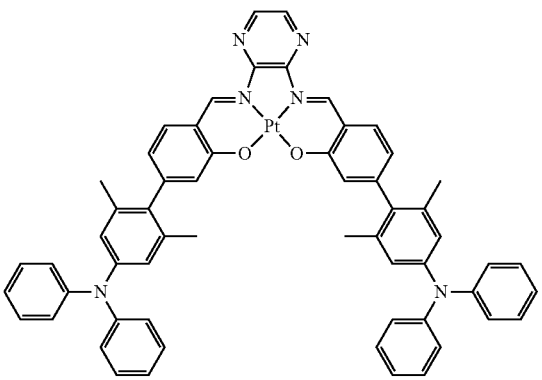
Emitter 116
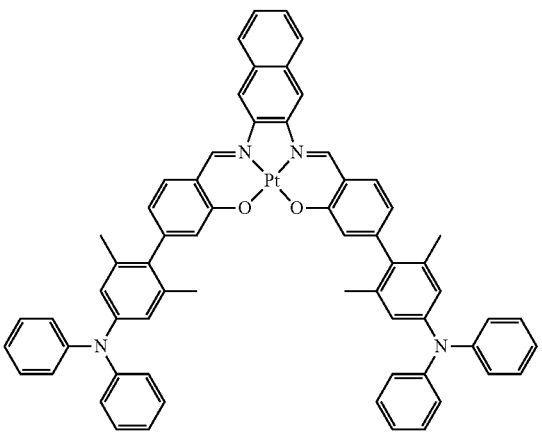
Emitter 113
Emitter 117
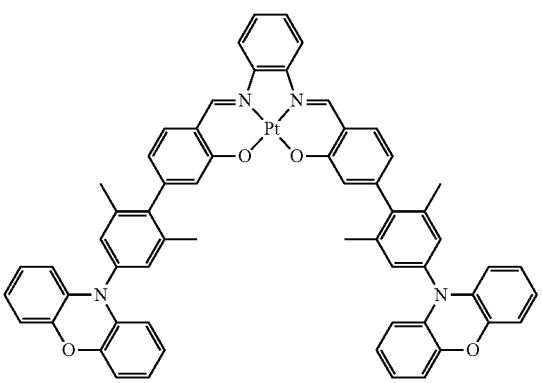

Emitter 118

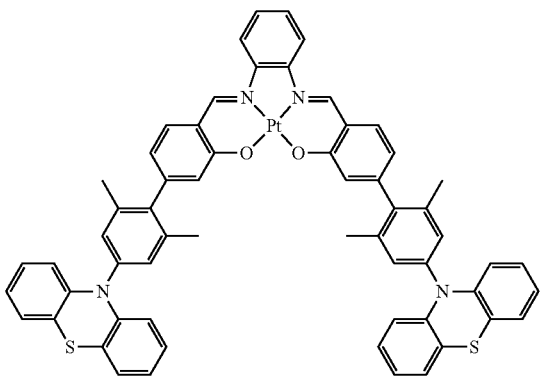

Emitter 119

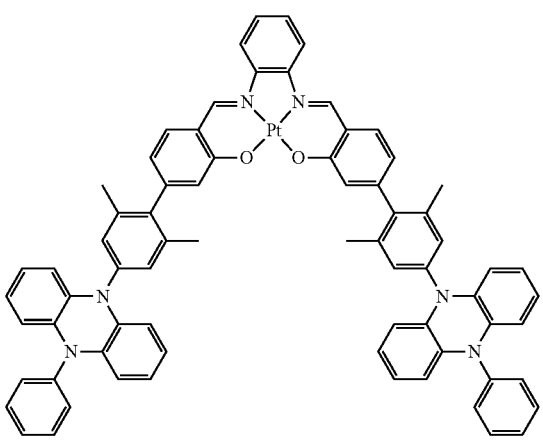

Emitter 120

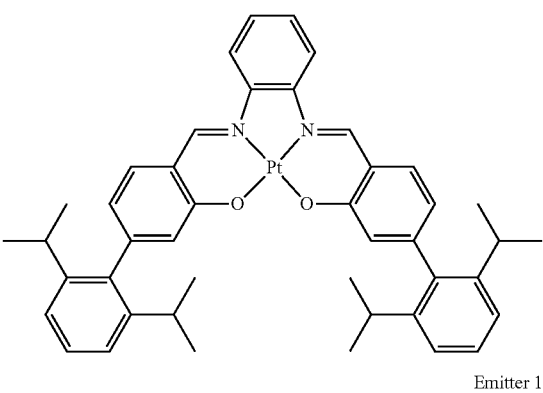

Emitter 121

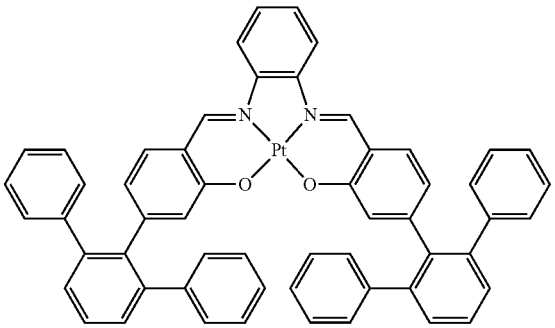

Emitter 122

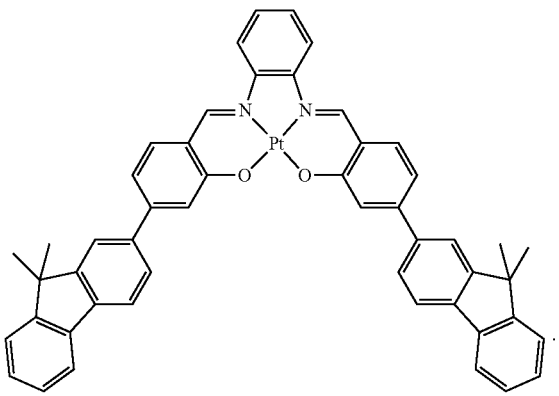

4. A light-emitting device, comprising at least one emissive layer, wherein at least one of the emissive layers comprises at least one OLED emitter according to claim 1, wherein the OLED emitter having a chemical structure of Structure I:

Structure I

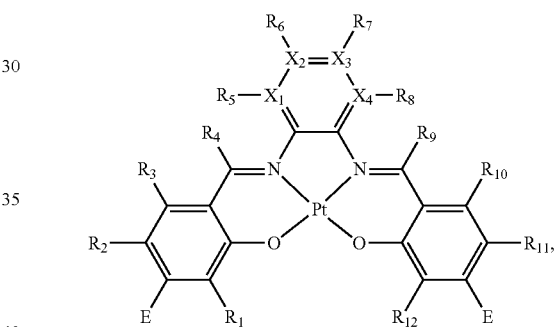

where Pt is in the oxidation state of II complexed to a tetradentate ligand where: $X_1$-$X_4$ are independently carbon, nitrogen, silicon or phosphorous; $R_1$-$R_{12}$ are independently selected from hydrogen, halogen, hydroxyl, unsubstituted alkyl, substituted alkyl, cycloalkyl, unsubstituted aryl, substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or alkoxycarbonyl; and E is an emission intensity enhancement group comprising an aromatic group conjugated to the ligand's phenyl groups, or where adjacent $R_1$-$R_{12}$ and E groups are independently combined in a 5-8 member ring, and $R_1$, $R_2$, $R_{11}$ and $R_{12}$ are not amino or a portion of a substituted nitrogen heterocyclic aromatic, wherein E group is:

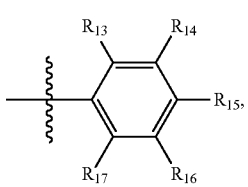

where $R_{13}$-$R_{17}$ are independently unsubstituted alkyl, substituted alkyl, cycloalkyl, unsubstituted aryl, substituted aryl, alkoxy or amino group, or where adjacent $R_{13}$-$R_{17}$ are independently combined in a 5-8 member ring, or
wherein E group is:

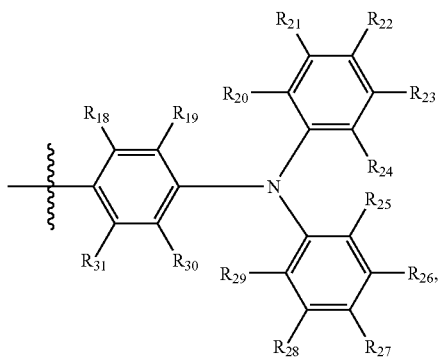

where $R_{18}$ and $R_{31}$ are independently hydrogen, methyl, isopropyl or phenyl group; $R_{19}$-$R_{30}$ are independently hydrogen, halogen, hydroxyl, unsubstituted alkyl, substituted alkyl, cycloalkyl, an unsubstituted aryl, substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or alkoxycarbonyl group; or where adjacent $R_{18}$-$R_{30}$ are independently combined in a 5-8 member ring.

5. The light-emitting device of claim 4, wherein the device is an organic light-emitting diode.

6. The light-emitting device of claim 4, wherein the device comprises a plurality of emissive layers.

7. A method of preparing a light-emitting device, comprising:
providing a transparent substrate;
providing a transparent electrode;
depositing a emitting layer comprising an emitter according to claim 1; and
depositing a counter electrode to the transparent electrode, wherein the emitter having a chemical structure of Structure I:

Structure I

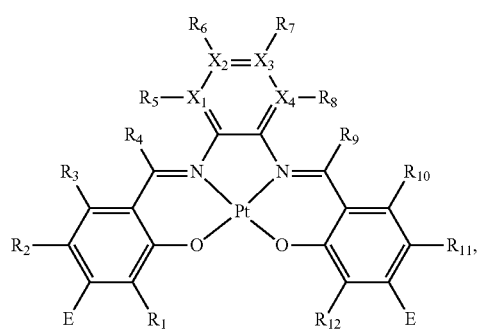

where Pt is in the oxidation state of II complexed to a tetradentate ligand where: $X_1$-$X_4$ are independently carbon, nitrogen, silicon or phosphorous; $R_1$-$R_{12}$ are independently selected from hydrogen, halogen, hydroxyl, unsubstituted alkyl, substituted alkyl, cycloalkyl, unsubstituted aryl, substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or alkoxycarbonyl; and E is an emission intensity enhancement group comprising an aromatic group conjugated to the ligand's phenyl groups, or where adjacent $R_1$-$R_{12}$ and E groups are independently combined in a 5-8 member ring, and $R_1$, $R_2$, $R_{11}$ and $R_{12}$ are not amino or a portion of a substituted nitrogen heterocyclic aromatic,
wherein E group is:

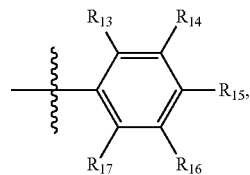

where $R_{13}$-$R_{17}$ are independently unsubstituted alkyl, substituted alkyl, cycloalkyl, unsubstituted aryl, substituted aryl, alkoxy or amino group, or where adjacent $R_{13}$-$R_{17}$ are independently combined in a 5-8 member ring, or
wherein E group is:

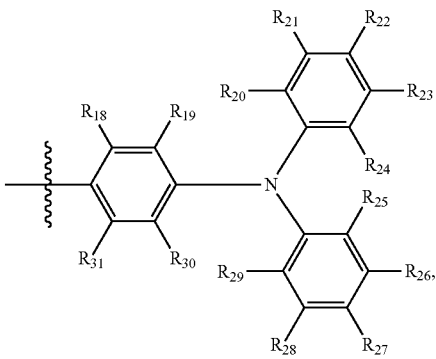

where $R_{18}$ and $R_{31}$ are independently hydrogen, methyl, isopropyl or phenyl group; $R_{19}$-$R_{30}$ are independently hydrogen, halogen, hydroxyl, unsubstituted alkyl, substituted alkyl, cycloalkyl, an unsubstituted aryl, substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or alkoxycarbonyl group; or where adjacent $R_{18}$-$R_{30}$ are independently combined in a 5-8 member ring.

8. The method according to claim 7, wherein depositing the emitting layer is from solution.

9. The method according to claim 7, wherein depositing the emitting layer is vapor depositing.

* * * * *